US012283468B2

(12) United States Patent
Stoltz et al.

(10) Patent No.: US 12,283,468 B2
(45) Date of Patent: Apr. 22, 2025

(54) METHODS AND SYSTEMS FOR INCREASING ENERGY OUTPUT IN Z-PINCH PLASMA CONFINEMENT SYSTEM

(71) Applicant: ZAP ENERGY, INC., Seattle, WA (US)

(72) Inventors: Peter H. Stoltz, Denver, CO (US); Eric T. Meier, Seattle, WA (US); Uri Shumlak, Seattle, WA (US); Brian A. Nelson, Edmonds, WA (US)

(73) Assignee: Zap Energy, Inc., Everett, WA (US)

( * ) Notice: Subject to any disclaimer, the term of this patent is extended or adjusted under 35 U.S.C. 154(b) by 0 days.

(21) Appl. No.: 18/510,456

(22) Filed: Nov. 15, 2023

(65) Prior Publication Data

US 2024/0212994 A1 Jun. 27, 2024

Related U.S. Application Data

(62) Division of application No. 18/198,798, filed on May 17, 2023.

(Continued)

(51) Int. Cl.
*H01J 37/32* (2006.01)
*G21B 1/05* (2006.01)
*G21B 1/21* (2006.01)

(52) U.S. Cl.
CPC .... *H01J 37/3266* (2013.01); *H01J 37/32064* (2013.01); *G21B 1/05* (2013.01); *G21B 1/21* (2013.01)

(58) Field of Classification Search
None
See application file for complete search history.

(56) References Cited

U.S. PATENT DOCUMENTS 4,252,607 A * 2/1981 Thode .................... G21B 1/23 376/105
4,263,095 A * 4/1981 Thode .................... G21B 1/19 376/152

(Continued)

OTHER PUBLICATIONS

Forbes, E. G. et al., "Progress Toward a Compact Fusion Reactor Using the Sheared-Flow-Stabilized Z-Pinch", Fusion Science and Technology, Jul. 3, 2019, 10 pages.

(Continued)

*Primary Examiner* — Srinivas Sathiraju
(74) *Attorney, Agent, or Firm* — Davis Wright Tremaine LLP

(57) ABSTRACT

Methods and systems are provided for increasing energy output from Z-pinch and other plasma confinement systems. In one example, a system may include memory storing instructions that, if executed by one or more processors, cause the system to adjust one or more parameters to generate a magnetic field which is sufficiently strong to axially compress a fuel gas to induce thermonuclear fusion and increase a fusion energy gain factor greater than a fusion energy gain factor limit attainable by the thermonuclear fusion. In certain examples, adjusting the one or more parameters may include adjusting a duty cycle of a discharge current applied to the fuel gas based, at least in part, on an amount of thermal collisions between fusion byproducts and the fuel gas. In certain examples, by adjusting the duty cycle, the magnetic field may be adjusted to induce or increase the thermal collisions.

24 Claims, 10 Drawing Sheets

Related U.S. Application Data

(60) Provisional application No. 63/344,534, filed on May 20, 2022.

(56) References Cited

U.S. PATENT DOCUMENTS 7,461,502 B2 * 12/2008 Emsellem ............ F03H 1/0081 60/202
7,482,607 B2 * 1/2009 Lerner .................... G21B 3/00 250/493.1
9,036,765 B2 * 5/2015 Birnbach ................ G21B 1/23 376/105
10,002,680 B2 * 6/2018 Laberge ................. F03G 7/002
10,813,207 B1 * 10/2020 Grossnickle ............ H05H 1/06
11,744,001 B2 * 8/2023 Meier ..................... H05H 1/54 315/111.21
11,758,640 B2 * 9/2023 Shumlak ................. H05H 1/06 315/111.61
2003/0152186 A1 * 8/2003 Jurczyk ................... G21B 1/19 376/109
2005/0271181 A1 * 12/2005 Winterberg ............. G21B 1/00 376/144
2006/0126771 A1 * 6/2006 Da Conceicao ......... G21G 1/04 376/100
2007/0064857 A1 * 3/2007 Winterberg ............. G21B 1/01 376/107
2007/0201598 A1 * 8/2007 Lerner .................. H05G 2/003 376/107
2008/0272317 A1 * 11/2008 Shumlak ............... H05G 2/003 250/504 R
2010/0215136 A1 * 8/2010 Rusnak ................... H05H 1/06 376/108
2011/0019789 A1 * 1/2011 Wessel .................... H05H 3/06 376/158
2011/0182392 A1 * 7/2011 Wessel .................... H05H 3/06 376/105
2015/0294743 A1 * 10/2015 Zheng ..................... G21B 1/15 376/107
2016/0027533 A1 * 1/2016 Fissenko ................. H05H 1/10 376/121
2017/0294238 A1 * 10/2017 Zheng ..................... G21B 1/15
2018/0220519 A1 * 8/2018 Grossnickle ............ H05H 1/06
2019/0277268 A1 * 9/2019 Nikic .................... F03H 1/0081
2020/0058411 A1 * 2/2020 Shumlak ................. H05H 1/04
2020/0168350 A1 * 5/2020 Shumlak ................. H05H 1/54
2021/0233674 A1 * 7/2021 You ......................... G21B 1/00
2022/0117072 A1 * 4/2022 Shumlak ................. H05H 1/16
2022/0124903 A1 * 4/2022 Fluhler ................... G21B 1/05
2022/0392651 A1 * 12/2022 Meier ..................... H05H 1/06
2022/0394838 A1 * 12/2022 Shumlak ................. H05H 1/54
2022/0394839 A1 * 12/2022 Shumlak ................. G21B 1/05
2022/0394840 A1 * 12/2022 Meier ..................... H05H 1/06
2023/0377762 A1 * 11/2023 Stoltz ............... H01J 37/32064

OTHER PUBLICATIONS

Mitrani, James M., et al., "Evidence for Thermonuclear Neutron Production on a Sheared-flow Stabilized (SFS) Z-pinch", 61st Annual Meeting of the APS Division of Plasma Physics, vol. 64, No. 11, Jul. 3, 2019, 1 page.

Claveau, Elliot L., et al., "Observation and Analysis of Thermonuclear Neutron Production in a Sheared-flow-stabilized Z-pinch", 60th Annual Meeting of the APS Division of Plasma Physics, vol. 63, No. 11, Nov. 2018, 1 page.

Golingo, Raymond, et al., "Increasing Neutron Production in the FuZE Experiment by Optimizing the Neutral Fill Profile and the Current Waveform", 60th Annual Meeting of the APS Division of Plasma Physics, vol. 63, No. 11, Nov. 2018, 1 page.

Mitrani, James, et al., "Temporally and Spatially Resolved Measurements of Neutron Production in a Sheared-flow Stabilized (SFS) Z-pinch", 60th Annual Meeting of the APS Division of Plasma Physics, vol. 63, No. 11, Nov. 2018, 1 page.

Shumlak, Uri, et al., "The Zap Flow Z-Pinch Project—Final Technical Report" University of Washington, Seattle, Dec. 31, 2013, 35 pages.

Goyon, et al., "Probing Plasma Conditions on the Sheared Flow Stabilized Z-pinch Using Optical Thomson Scattering at Zap Energy", 64th Annual Meeting of the APS Division of Plasma Physics, Spokane Washington, Oct. 2022, 1 page.

Shumlak, U., "Z Pinch Fusion" Journal of Applied Physics, vol. 127, 200901, May 27, 2020, 11 pages.

Masti, R. L., et al.,"Cross-code Verification and Sensitivity Analysis to Effectively Model the Electrothermal Instability", High Energy Density Physics, vol. 38, Feb. 13, 2021, 14 pages.

Stoltz, P. H., et al.,"A New Simple Algorithm for Space Charge Limited Emission", Physics of Plasmas, vol. 27, No. 9, Jul. 3, 2020, 19 pages.

Spirkin, A., et al., "Machine Learning Investigation of the Rising Sun Magnetron Design and Operation", IEEE Transactions on Plasma Science, vol. 48, No. 1, Jan. 2020, 8 pages.

Thio, Y. C. F., et al., "Plasma-Jet-Driven Magneto-Inertial Fusion", Fusion Science and Technology, May 2019, vol. 75, No. 7, 34 pages.

Hsu, S. C., et al., "Experiment to Form and Characterize a Section of a Spherically Imploding Plasma Liner", IEEE Transactions on Plasma Science, vol. 46, No. 6, Apr. 2018, 11 pages.

European Patent Office, "Search Report and Written Opinion" in Application No. PCT/US2023/067149, Aug. 9, 2023, 12 pages.

* cited by examiner

800

METHODS AND SYSTEMS FOR INCREASING ENERGY OUTPUT IN Z-PINCH PLASMA CONFINEMENT SYSTEM

CROSS-REFERENCE TO RELATED APPLICATION

The present application is a divisional of U.S. patent application Ser. No. 18/198,798, entitled "METHODS AND SYSTEMS FOR INCREASING ENERGY OUTPUT IN Z-PINCH PLASMA CONFINEMENT SYSTEM" and filed on May 17, 2023, which claims priority to U.S. Provisional Application No. 63/344,534, entitled "METHODS AND SYSTEMS FOR INCREASING ENERGY OUTPUT IN Z-PINCH PLASMA CONFINEMENT SYSTEM" and filed on May 20, 2022. The entire contents of each of the above-identified applications are hereby incorporated by reference for all purposes.

FIELD

Embodiments of the subject matter disclosed herein relate to methods and systems for plasma confinement to induce thermonuclear fusion reactions, and more particularly for increasing energy output by adjusting one or more operating parameters of a Z-pinch plasma confinement system.

BACKGROUND

The "holy grail" of harnessing cheap, efficient, and renewable energy is widely considered to lie with production-scale generation of self-sustaining, capturable fusion power or "fusion ignition." For a given fusion device, approaching fusion ignition may be treated as an optimization problem. For example, this problem may be practically reduced to optimization of one or more operating parameters which maximize a fusion energy gain factor Q, which may be defined as:

$$Q=P_f/P_{in}$$

where $P_f$ is a power released by fusion reactions in the fusion device and $P_{in}$ is a heating power input to the fusion device under a set of standard operating conditions. However, even for one of ordinary skill in the art, significant and undue experimentation may be necessary to determine which operating parameters are to be adjusted, and to what extent, to achieve fusion ignition. Moreover, difficulties in successfully configuring a fusion device capable of performing such adjustments and harnessing resultant energy output may further deter exploration of operating parameter adjustments at or above expected physical limits.

BRIEF DESCRIPTION OF THE DRAWINGS

Various embodiments and techniques will be described with reference to the drawings, in which.

DETAILED DESCRIPTION

Figure 1:
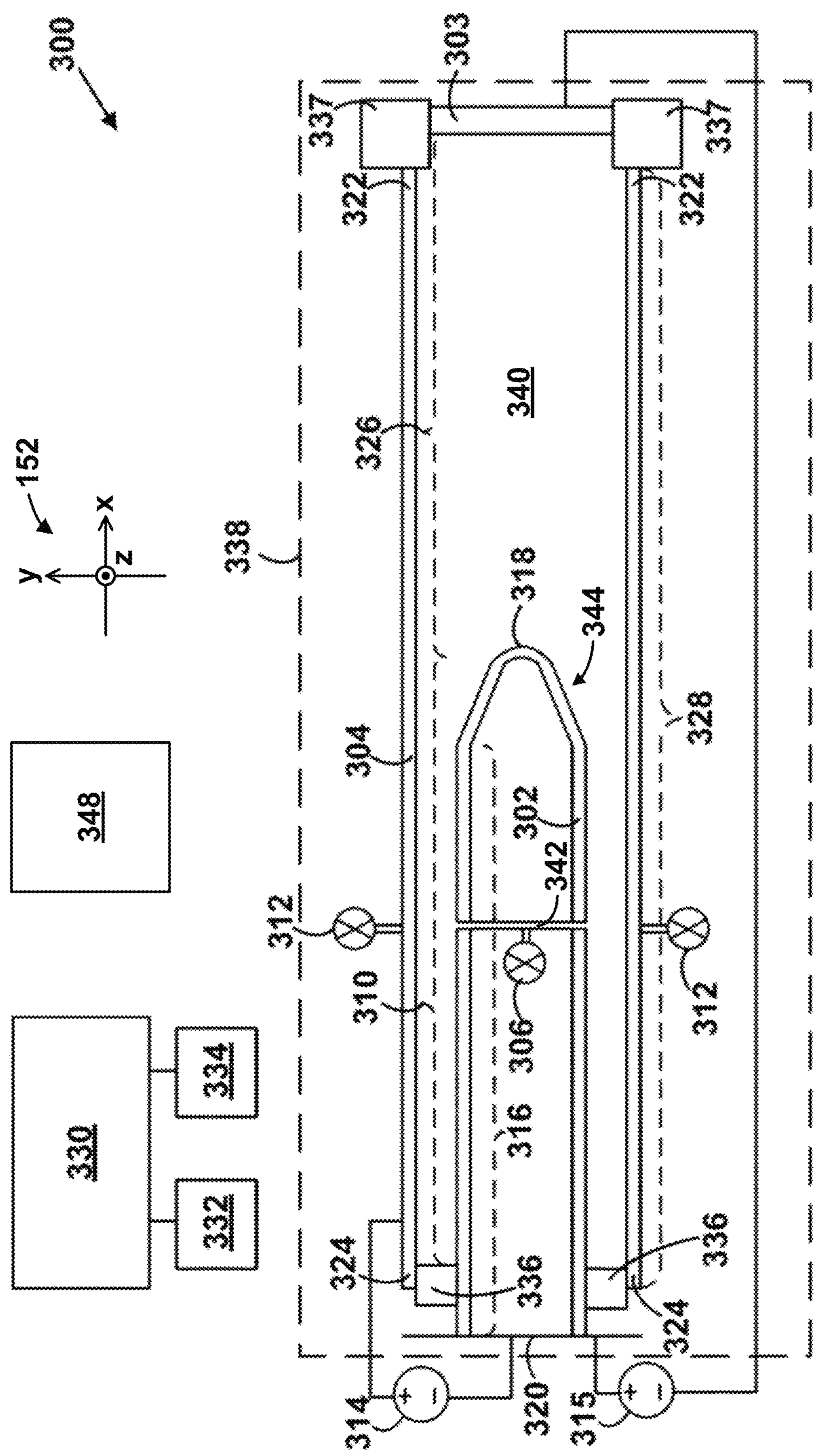
FIG. 1 shows a schematic cross-sectional diagram of a plasma confinement system, in accordance with at least one embodiment.

Techniques described and suggested herein include a system, including non-transitory memory to store executable instructions that, if executed by one or more processors, cause the system to adjust one or more operating parameters to generate a magnetic field which may be sufficiently strong to axially compress a fuel gas to induce thermonuclear fusion and increase a fusion energy gain factor greater than a fusion energy gain factor limit attainable by the thermonuclear fusion. The one or more operating parameters may be one or more operating parameters of a plasma confinement system in which the magnetic field may be generated.

In at least one embodiment, a plasma confinement system may include a plasma confinement chamber and a controller including executable instructions stored in non-transitory memory which, if executed by one or more processors of the controller, cause the controller to identify a threshold amount of thermal collisions of alpha particles with a fuel gas and adjust a duty cycle of a discharge current applied to the fuel gas contained within the plasma confinement chamber to achieve the threshold amount of thermal collisions of the alpha particles with the fuel gas.

In at least one embodiment, a method may include adjusting a magnetic field from a first intensity value applied to axially compress a fuel gas within a plasma confinement chamber to a second intensity value which results in greater thermal collisions between alpha particles and the fuel gas than the magnetic field at the first intensity value. The plasma confinement chamber may be configured within a plasma confinement system.

These, as well as other aspects, advantages, and alternatives will become apparent to those of ordinary skill in the art by reading the following detailed description, with reference where appropriate to the accompanying drawings. Further, it should be understood that descriptions and figures provided herein are intended to illustrate the invention by way of example only and, as such, that numerous variations are possible.

For example, the following description relates to various embodiments of systems and methods for confining a plasma within a fusion device to sufficient temperature and sufficient density for sufficient duration to induce thermonuclear fusion. In some embodiments, output from the thermonuclear fusion may be harnessed for energy generation/storage. However, other use cases are envisioned for the disclosed embodiments or variations thereof, such as propulsion (e.g., for space vehicles, aircraft, watercraft and submersibles, etc.), research, etc. In extreme environments (e.g., reduced gravity environments aboard space vehicles), certain modifications may be made, e.g., to maintain performance.

In an example embodiment, plasma confinement may be achieved via a Z-pinch configuration, wherein an electric current (also known as the "Z-pinch discharge current" or "pinch current") is discharged through the plasma to generate a magnetic field which compresses or "pinches" the plasma in along an axis (e.g., along a linear path through an assembly region of a plasma confinement chamber). In such an embodiment, a fusion energy gain factor Q for the Z-pinch configuration may be expected to "level off" at a predetermined value. For example, given a set of conditions (e.g., pinch current amplitude, pulse duration, duty cycle, etc.), Q may reach an upper limit above which further optimization of various operating parameters may be expected to yield diminishing returns. Certain configurations, such as the Z-pinch configuration described above, may therefore not be configured to harness more power than prescribed by the expected upper limit of Q. For example, there may be little to no motivation to construct or operate a Z-pinch plasma confinement system so as to obtain a power output higher than expected given a presumed upper limit of Q.

However, embodiments described herein are at least partially based upon an unexpected regime of Z-pinch plasma confinement operation. In at least one embodiment, for instance, a Z-pinch plasma confinement system may be configured to adjust (e.g., increase) a magnetic field applied to compress a plasma to induce or increase thermal collisions between fusion byproducts, such as alpha particles ($^{4}He$), and fuel gas species, such as deuterium- and/or tritium-containing species (e.g., $D_2$, $T_2$, etc.), $^{3}He$, $^{6}Li$, $^{11}B$, etc. A technical effect resulting from such collisions is that kinetic energy of the fusion byproducts may be converted into thermal energy, which may increase a fusion yield and an energy output of the Z-pinch plasma confinement system and thus Q overall.

Adjusting the magnetic field to increase such thermal collisions may be accomplished in a number of ways. In some embodiments, thermal collisions may be increased by increasing an amplitude of the Z-pinch discharge current and/or increasing an applied voltage driving the Z-pinch discharge current. Accordingly, a duty cycle of the Z-pinch discharge current may be adjusted based on corresponding adjustments to absolute magnitudes of the Z-pinch discharge current and/or the applied voltage. In additional or alternative embodiments, the duty cycle may be adjusted so as to maintain energy output while increasing thermal collisions. For example, a pulse duration of the Z-pinch discharge current may be decreased while the amplitude of the Z-pinch discharge current is concomitantly increased. Accordingly, a shorter duty cycle may be obtained for the same energy output by adjusting a set of operating parameters (e.g., the amplitude and the pulse duration of the Z-pinch discharge current) to obtain a greater portion of the energy output from the thermal collisions. Advantageously, an efficiency of the energy output may be increased with a higher repetition rate or longer periods between current pulses (e.g., to "flush out" or otherwise remove excess particles). More broadly, an operator of the Z-pinch plasma confinement system may tune the duty cycle to adjust the efficiency of the energy output as desired based on energy storage abilities, energy generation demands, etc.

In additional, alternative, or otherwise modified embodiments to those described above and in detail below with reference to FIGS. 1-9, one or more components of the plasma confinement system may be added, removed, substituted, modified, or interchanged to adapt the plasma confinement system for a given use case. As an example, a plasma may be directly injected into a plasma confinement chamber of the plasma confinement system, e.g., in addition to or instead of intrachamber conversion of fuel gas species to the plasma. Further, though various embodiments described herein are discussed with reference to Z-pinch plasma confinement, the various embodiments, with or without modification, may be applicable to other types of thermonuclear fusion energy systems and plasma confinement systems which compress, react, or otherwise use plasma.

Figure 2:
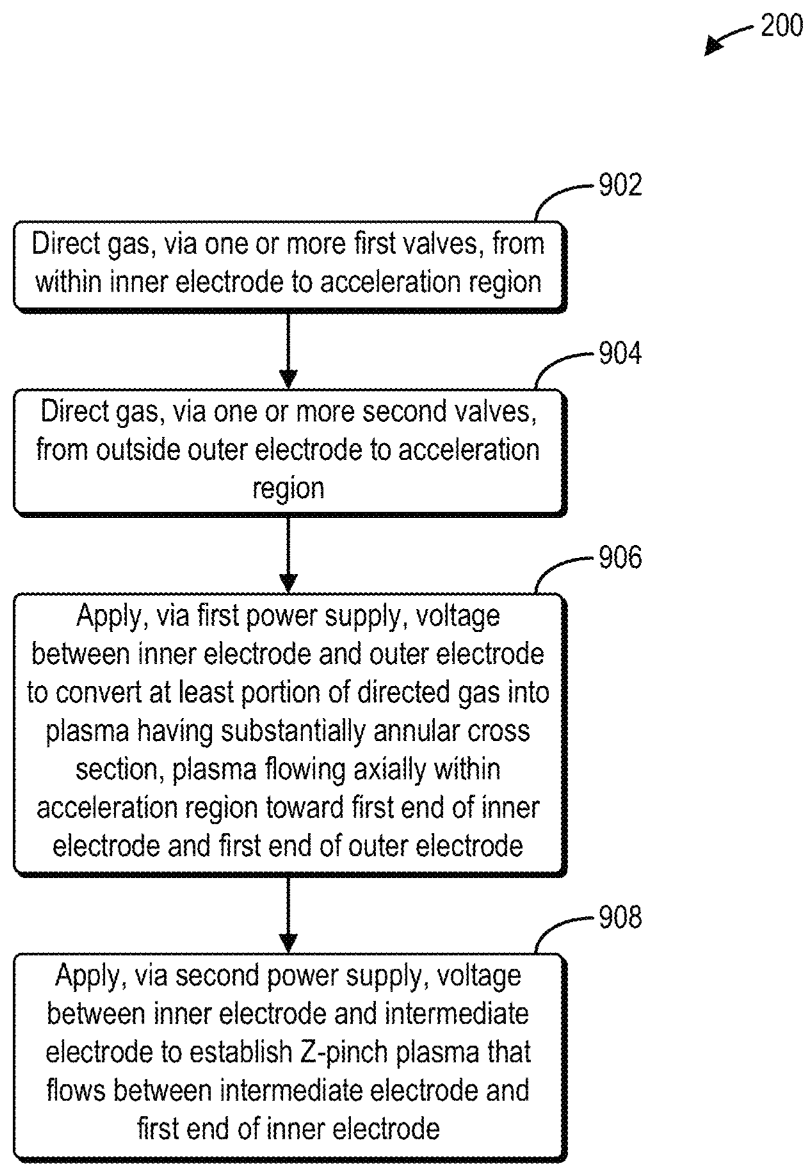
FIG. 2 shows a block diagram of a method for operating a plasma confinement system, for example, by initiating and driving a sheared ion velocity flow therein for stabilization of a Z-pinch discharge, in accordance with at least one embodiment.

Referring now to FIG. 1, a schematic cross-sectional diagram of a plasma confinement system 300, such as may be included within a thermonuclear fusion energy system, device, reactor, or other such apparatus or system, is shown. The plasma confinement system 300 may generate a plasma arc within an assembly region 326 of a plasma confinement chamber 340, the plasma arc confined, compressed, and sustained by an axially symmetric magnetic field. The axially symmetric magnetic field may be stabilized by a sheared ion velocity flow driven by electrical discharge between a pair of electrodes interfacing with the plasma confinement chamber 340. FIGS. 2-3F discuss further operational details of the plasma confinement system 300. One or more aspects of the plasma confinement system 300 may be readily transferable to other plasma confinement configurations, such as plasma confinement system 900 described in detail below with reference to FIG. 4.

In at least one embodiment, one or more operating parameters of a plasma confinement system, such as the plasma confinement system 300, may be adjusted to account for thermal collisions between fusion byproducts (e.g., $^{4}He$) and a fuel gas (e.g., $D_2$, $T_2$, etc.). An exemplary method for operating the plasma confinement system to induce or increase such thermal collisions is discussed in detail below with reference to FIG. 5. Such adjustments may include adjustments to a duty cycle of a discharge current applied to the fuel gas; exemplary duty cycles are provided in FIG. 6.

Figure 7:
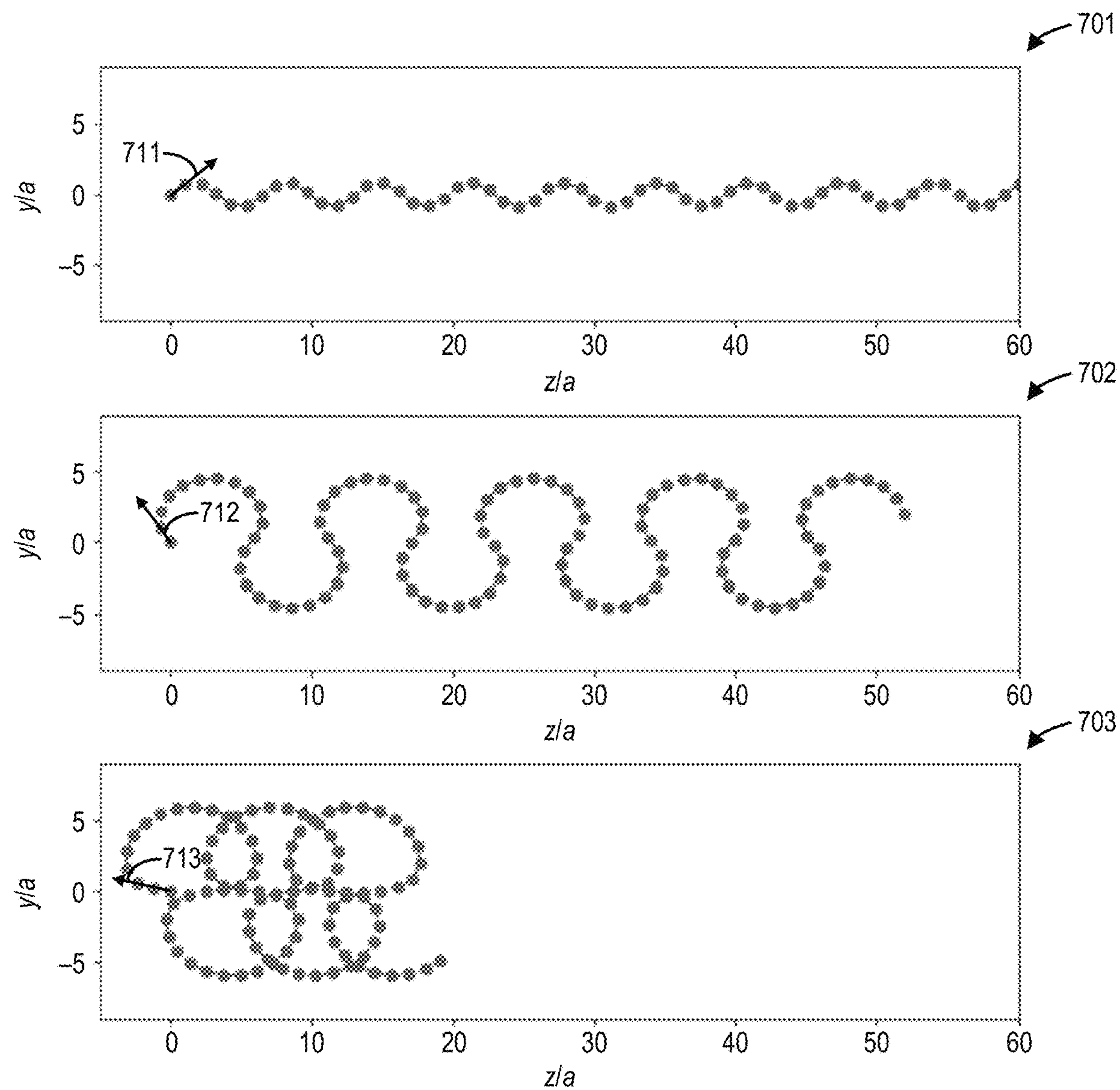
FIG. 7 shows plots of exemplary trajectories of alpha particles confined within a magnetic field generated by a plasma confinement system, in accordance with at least one embodiment.
Figure 8:
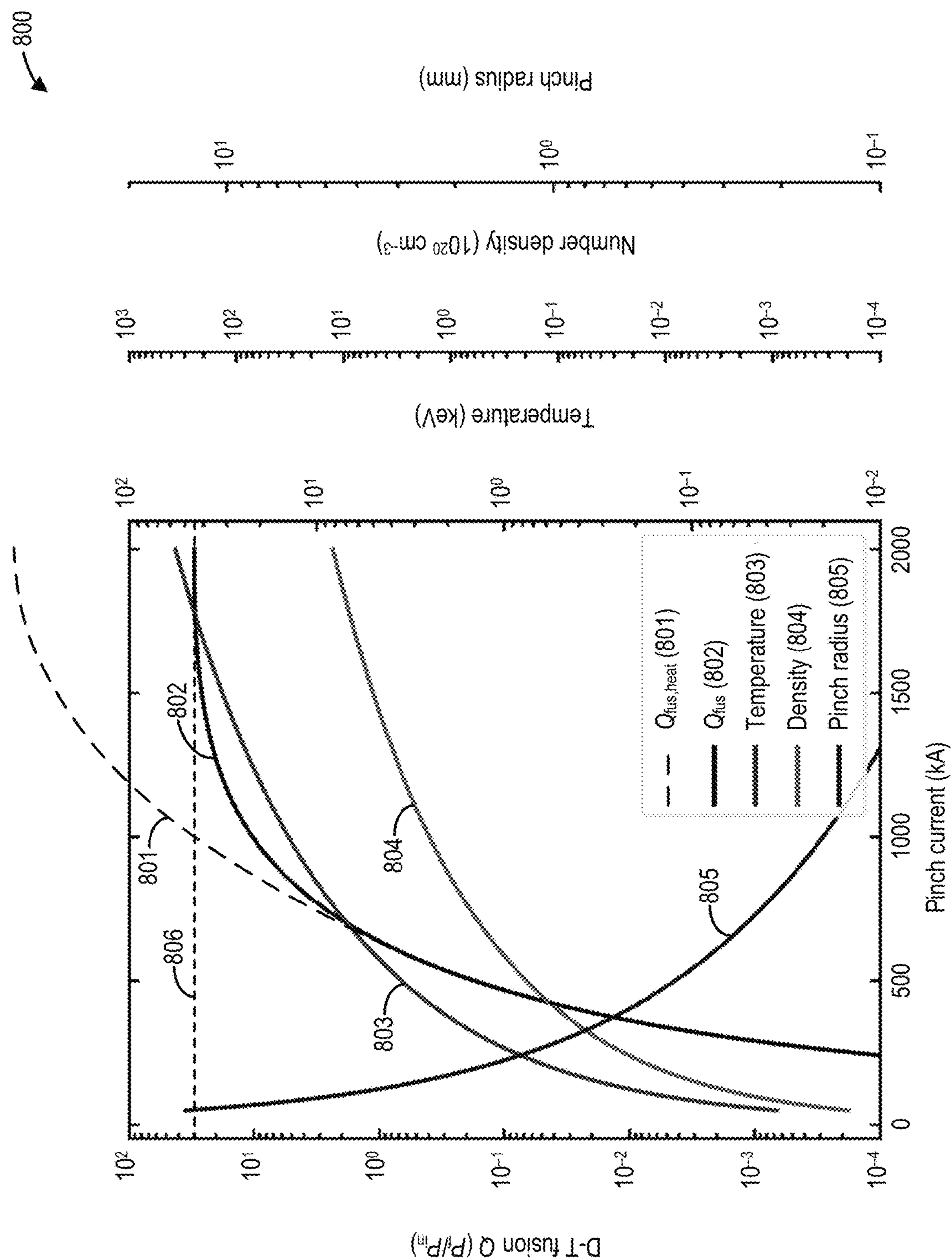
FIG. 8 shows a composite plot of expected fusion energy gain factors generated by a plasma arc confined within a plasma confinement system and plasma temperature, plasma density, and pinch radius of the confined plasma arc as a function of Z-pinch discharge current, in accordance with at least one embodiment.
Figure 9:
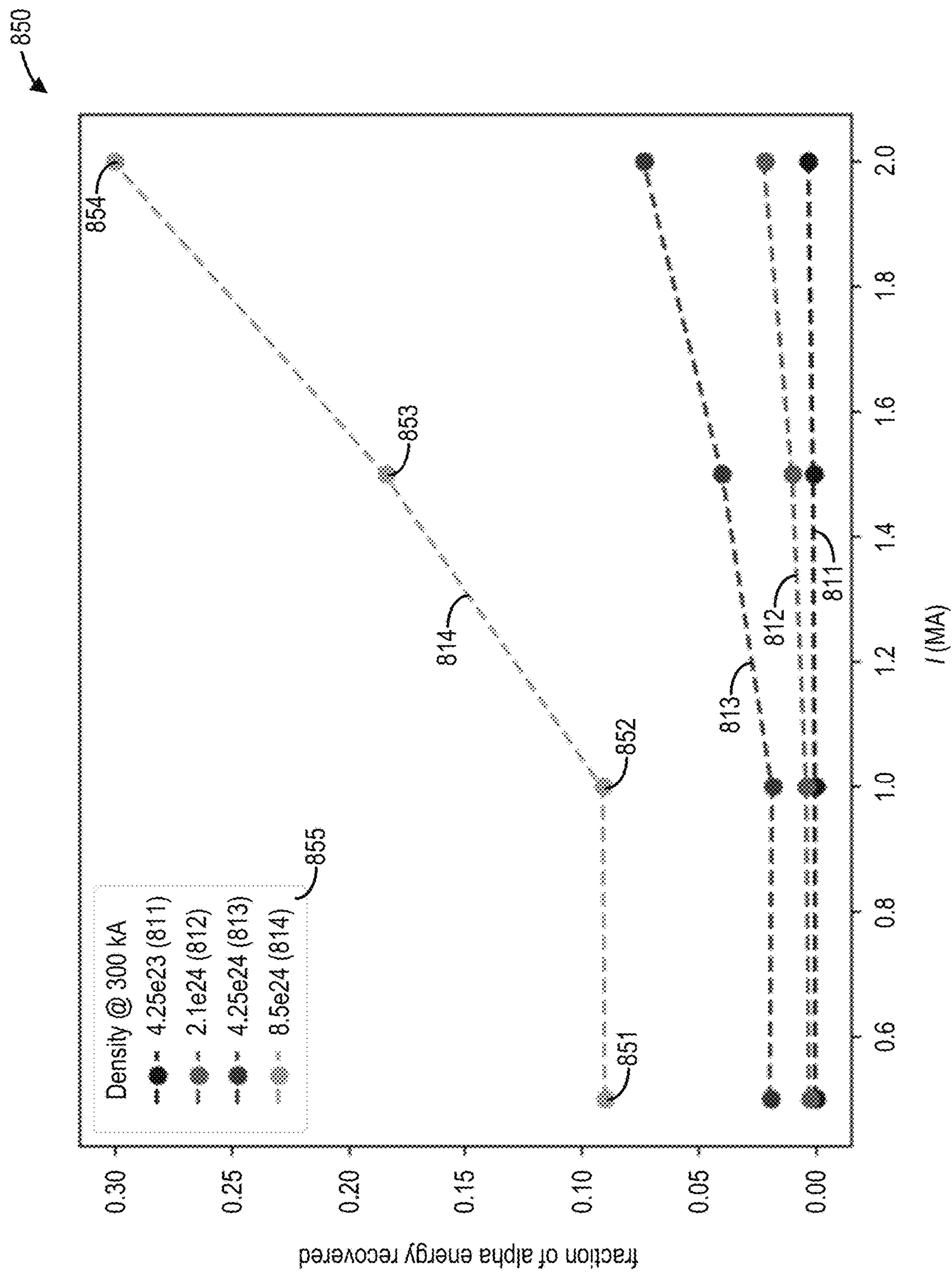
FIG. 9 shows a plot of thermal energy recovery and plasma density as a function of Z-pinch discharge current, in accordance with at least one embodiment.

Certain plasma confinement configurations, such as a Z-pinch plasma confinement configuration, may retain a relatively high proportion of the fusion byproducts during a plasma arc generation phase (regardless of an initial velocity of a given fusion byproduct, as illustrated in FIG. 7). Accordingly, provided with sufficient Z-pinch discharge current, a regime of thermal heating may be accessed wherein the fusion byproducts collide with fuel gas particles and convert kinetic energy of the collisions to thermal energy. As indicated in FIG. 8, such additional thermal energy may concomitantly increase a fusion energy gain factor. Moreover, and as indicated in FIG. 9, greater thermal energy may be accessed with corresponding increases to the Z-pinch discharge current and a plasma density within the plasma confinement chamber.

A set of Cartesian coordinate axes 152 is shown in FIG. 1 for contextualizing positions of the various components of the plasma confinement system 300 and for comparing between the various views of FIGS. 1 and 3A-3F. Specifically, x-, y-, and z-axes are provided which are mutually perpendicular to one another, where the x- and y-axes define a plane of the schematic cross-sectional diagram shown in FIG. 1 and the z-axis is perpendicular thereto. In some embodiments, a direction of gravity may be parallel to and coincident with any direction in the plane of the schematic cross-sectional diagram of FIG. 1. For example, the direction of gravity may be parallel and coincident with a positive direction of the x-axis. In additional or alternative embodiments, the direction of gravity may be within a plane defined by the y- and z-axes (e.g., parallel and coincident with a negative direction of the y-axis).

In an example embodiment, the plasma confinement system 300 may include an inner electrode 302 and an outer electrode 304 that substantially surrounds the inner electrode 302 (when the term "substantially" is used herein, it is meant that the recited characteristic, parameter, or value need not be achieved exactly, but that deviations or variations, including, for example, tolerances, measurement error, measurement accuracy limitations, and other factors known to those of skill in the art, may occur in amounts that do not preclude the effect the characteristic was intended to provide). For example, the inner electrode 302 may be at least partially circumferentially surrounded by the outer electrode 304, such that one end of the inner electrode 302 (e.g., a first end 318) may be partially or fully surrounded by the outer electrode 304. In some embodiments, the inner electrode 302 may have a length (e.g., parallel with the y-axis and between the first end 318 and an opposing second end 320) ranging from 25 cm to 1 m or more and a radius (e.g., parallel with the x-axis) ranging from 2 cm to 1 m, and the outer electrode 304 may have a length (e.g., parallel with the y-axis and between a first end 322 and an opposing second end 324) ranging from 50 cm to 6 m, a radius (e.g., parallel with the x-axis) ranging from 6 cm to 2 m or more, and an annular thickness (e.g., along the x-axis) ranging from 6 mm to 12 mm.

In certain embodiments, and as shown in FIG. 1, the plasma confinement system 300 may further include an intermediate electrode 303 that faces the inner electrode 302. In other embodiments, and as described in detail below with reference to FIG. 4, the intermediate electrode 303 may substantially surround the inner electrode 302 and the outer electrode 304 may substantially surround the intermediate electrode 303. For example, the inner electrode 302 may be at least partially circumferentially surrounded by the intermediate electrode 303 and the intermediate electrode 303 may be at least partially circumferentially surrounded by the outer electrode 304, such that one end of the inner electrode 302 (e.g., the first end 318) may be partially or fully surrounded by the intermediate electrode 303 and one end of the intermediate electrode 303 may be partially or fully surrounded by the outer electrode 304.

In some embodiments, the plasma confinement chamber 340 may be a physical structure inclusive of a volume delimited by one or more electrodes, insulators, and internal components of the plasma confinement system 300. As such, in certain embodiments, the plasma confinement chamber 340 may include the one or more electrodes, insulators, and internal components of the plasma confinement system 300 which delimit the volume of the plasma confinement chamber 340.

In an example embodiment, the outer electrode 304 may define a radial outer boundary of the plasma confinement chamber 340. In one example, the radial outer boundary may be cylindrical and formed as a circular cross section propagated along the x-axis, the circular cross section parallel to a plane formed by the y- and z-axes. The plasma confinement chamber 340 may be partitioned (e.g., without any physical partition) into: an acceleration region 310 between the inner electrode 302 and the outer electrode 304, and the assembly region 326 between the first end 318 of the inner electrode 302 and the intermediate electrode 303. Alternatively, in embodiments where the intermediate electrode 303 at least partially surrounds the inner electrode 302, the acceleration region 310 may be between the inner electrode 302 and the intermediate electrode 303, and the assembly region 326 may be between the first end 318 of the inner electrode 302 and an opposing end of the outer electrode 304. In either case, the plasma confinement system 300 may include a plurality of electrodes (e.g., the inner electrode 302, the intermediate electrode 303, and the outer electrode 304), each electrode of the plurality of electrodes arranged coaxially with respect to the assembly region 326 (e.g., parallel to the x-axis) and positioned so as to be exposed to the assembly region 326 (e.g., each given electrode of the plurality of electrodes may interface with a volume of the assembly region 326 without any intervening components or volumes, such that an electrical current can pass directly from a confined plasma to the given electrode). More specifically, the outer electrode 304 may be positioned to define at least a portion of an outer boundary of the assembly region 326, the inner electrode 302 may be positioned at one end of the assembly region 326 (e.g., coincident with the first end 318 of the inner electrode 302), and the intermediate electrode 303, when included, may be positioned at the same end of the assembly region 326 with respect to the inner electrode 302 or an opposite end of the assembly region 326 with respect to the inner electrode 302. The plasma confinement system 300 may be configured to sustain a Z-pinch plasma (e.g., the plasma arc) within the assembly region 326 as described below. In some embodiments, the acceleration region 310 may have a length (e.g., parallel with the y-axis and between the second end 324 of the outer electrode 304 and the first end 318 of the inner electrode 302) ranging from 25 cm to 1.5 m and an annular thickness ranging from 2 cm to 10 cm, and the assembly region 326 may have a length (e.g., parallel with the y-axis and between the first end 318 of the inner electrode 302 and the first end 322 of the outer electrode 304) ranging from 25 cm to 3 m.

The plasma confinement system 300 may include one or more first valves 306 configured to direct gas from within the inner electrode 302 to the acceleration region 310 and one or more second valves 312 configured to direct gas from outside the outer electrode 304 to the acceleration region 310. The gas may be the fuel gas, which may be utilized to form the plasma arc upon release of the gas into the plasma confinement chamber 340 and application of the discharge current. As used herein, "fuel gas" may refer to any species utilized to form the plasma arc. As such, the fuel gas may include neutral gas species, such as dihydrogen [e.g., hydrogen ($H_2$), deuterium ($D_2$), and/or tritium ($T_2$)], $^{3}He$, $^{6}Li$, $^{11}B$, etc., and/or pre-ionized gas species (e.g., such as introduced via "direct plasma injection" or "plasma injection" configurations).

The plasma confinement system 300 may include a first power supply 314 configured to apply a voltage (e.g., ranging from 2 kV to 50 kV in some examples or from 1 kV to 40 kV in other examples) between the inner electrode 302 and the outer electrode 304. In some embodiments, the plasma confinement system 300 may further include a second power supply 315 configured to apply a voltage (e.g., ranging from 2 kV to 50 kV in some examples or from 1 kV to 40 kV in other examples) between the inner electrode 302 and the intermediate electrode 303. In certain embodiments, the plasma confinement system 300 may operate with only one of the first and second power supplies 314, 315. In other embodiments, the plasma confinement system 300 may operate at least with both of the first and second power supplies 314, 315. In some embodiments, one or both of the first and second power supplies 314, 315 may include a switching pulsed direct current (switching pulsed-DC) power supply including an energy source (e.g., a capacitor bank), a switch (e.g., a spark gap, an ignitron, or a semiconductor switch), and a pulse shaping network (including, e.g., inductors, resistors, diodes, and the like). In some embodiments, one or both of the first and second power supplies 314, 315 may be voltage-controlled. In other embodiments, one or both of the first and second power supplies 314, 315 may be current-controlled. In some embodiments, other suitable types of power supplies may be used as one or both of first and second power supplies 314, 315, including DC and alternating current (AC) power supplies (e.g., DC grids, voltage source converters, homopolar generators, and the like).

The inner electrode 302 may include an electrically conducting (e.g., stainless steel) shell having a modified cylindrical body 316 (e.g., a substantially cylindrical body with a tapered, rounded base at the first end 318). Specifically, the inner electrode 302 may include the first end 318 (e.g., a tapered, rounded base) and the opposing second end 320 (e.g., a substantially flat, circular base). For instance, the inner electrode 302 may include a nosecone 344 positioned at the first end 318, the nosecone 344 exposed to the assembly region 326 so as to be intersected by an axis of the confined plasma arc coaxial with each electrode of the plurality of electrodes (e.g., parallel to the x-axis). The inner electrode 302 may further include one or more conduits or channels 342 for routing gas (e.g., the fuel gas) from the one or more first valves 306 to the acceleration region 310, for example, during operation of the plasma confinement system 300 to generate thermonuclear fusion.

The outer electrode 304 may include an electrically conducting (e.g., stainless steel) shell having a substantially cylindrical body 328. Specifically, the outer electrode 304 may include the first end 322 (e.g., a substantially flat, circular base) and the opposing second end 324 (e.g., a substantially flat, circular base). The outer electrode 304 may surround much (e.g., a majority) of the inner electrode 302. In an example embodiment, the inner electrode 302 and the outer electrode 304 may be concentric and have radial symmetry with respect to the x-axis. The first end 318 of the inner electrode 302 may be between the first end 322 of the outer electrode 304 and the second end 324 of the outer electrode 304. The outer electrode 304 may further include one or more conduits or channels (not shown at FIG. 1) for routing gas (e.g., the fuel gas) from the one or more second valves 312 to the acceleration region 310, for example, during operation of the plasma confinement system 300 to generate thermonuclear fusion.

The intermediate electrode 303 may include an electrically conducting material (e.g., stainless steel). In some embodiments, the intermediate electrode 303 may be substantially disc-shaped. In other embodiments, the intermediate electrode may have a substantially cylindrical body concentric with each of the inner electrode 302 and the outer electrode 304 and having radial symmetry with respect to the x-axis.

The one or more first valves 306 may take the form of so-called "puff valves" (e.g., operable to provide fuel gas for formation of a plasma or increase a density of the as-generated plasma arc via gas puffing) or plasma injectors. In additional or alternative embodiments, the one or more first valves 306 may include at least one electrically actuated valve, such as a solenoid-driven valve. However, the one or more first valves 306 are not limited to such configurations and may include any type of valve configured to direct gas (e.g., $H_2$, $D_2$, and/or $T_2$) from within the inner electrode 302 to the acceleration region 310.

In some embodiments, the one or more first valves 306 may include at least one gas-puff valve (e.g., to provide neutral gas to the acceleration region 310) and/or at least one plasma injector (e.g., to provide pre-ionized gas to the acceleration region 310) installed as a regular array or arrays along the inner electrode 302 (e.g., regularly distributed around a central axis of the acceleration region 310). As shown in FIG. 1, the one or more first valves 306 may be positioned (e.g., positioned axially) between the first end 318 of the inner electrode 302 and the second end 320 of the inner electrode 302. Alternatively, the one or more first valves 306 may be located at (e.g., directly adjacent to) the first end 318 of the inner electrode 302 or the second end 320 of the inner electrode 302. In FIG. 1, each of the one or more first valves 306 is arranged within (e.g., positioned inside and on an inner surface of) the inner electrode 302, but other examples are possible (e.g., positioned outside and on an outer surface of the inner electrode 302). The one or more first valves 306 may be electrically actuatable in that the one or more first valves 306 may be operated by providing the one or more first valves 306 with a control voltage, as described below.

In an example embodiment, the acceleration region 310 may have a substantially annular cross section defined by the shapes of the inner electrode 302 and the outer electrode 304. Specifically, the inner electrode 302 may define a radial inner boundary of the acceleration region 310 and the outer electrode 304 may define a radial outer boundary of the acceleration region 310. In one example, each of the radial inner boundary and the radial outer boundary may be cylindrical and formed as a circular cross section propagated along the x-axis, the circular cross section parallel to the plane formed by the y- and z-axes. In other embodiments, the substantially annular cross section of the acceleration region 310 may be defined by the shapes of the inner electrode 302 and the intermediate electrode 303 (e.g., the inner electrode 302 may defined the radial inner boundary and the intermediate electrode 303 may define the radial outer boundary).

In the same manner as the one or more first valves 306, the one or more second valves 312 may take the form of "puff valves" or plasma injectors. In additional or alternative embodiments, the one or more second valves 312 may include at least one electrically actuated valve, such as a solenoid-driven valve. However, the one or more second valves 312 are not limited to such configurations and may include any type of valve configured to direct gas (e.g., $H_2$, $D_2$, and/or $T_2$) from outside the outer electrode 304 (or the intermediate electrode 303) to the acceleration region 310.

In some embodiments, the one or more second valves 312 may include at least one gas-puff valve (e.g., to provide neutral gas to the acceleration region 310) and/or at least one plasma injector (e.g., to provide pre-ionized gas to the acceleration region 310) installed as a regular array or arrays along the outer electrode 304 (e.g., regularly distributed around the acceleration region 310). As shown in FIG. 1, the one or more second valves 312 may be positioned (e.g., positioned axially) between the first end 322 of the outer electrode 304 and the second end 324 of the outer electrode 304. Alternatively, the one or more second valves 312 may be located at (e.g., directly adjacent to) the first end 322 of the outer electrode 304 or the second end 324 of the outer electrode 304. In FIG. 1, each of the one or more second valves 312 is arranged around (e.g., positioned outside and on an outer surface of) the outer electrode 304, but other examples are possible (e.g., positioned within the plasma confinement chamber 340, such as on an inner surface of the outer electrode 304 or on an inner surface of the intermediate electrode 303). Moreover, in FIG. 1, each of the one or more first valves 306 is axially aligned with each of the one or more second valves 312, but other examples are possible. The one or more second valves 312 may be electrically actuatable in that the one or more second valves 312 may be operated by providing the one or more second valves 312 with a control voltage, as described below.

In some embodiments, gas-puff valves and/or plasma injectors included in the one or more first valves 306 and/or the one or more second valves 312 may be electronically triggered to independently deliver a "puff" of filling neutral and/or pre-ionized gas for a duration lasting up to several hundred μs (e.g., up to 1 ms). An amount of filling gas (also referred to herein as "fuel gas") delivered (e.g., in the "puff") may also be controlled by adjustments of a filling gas pressure supplied to the gas-puff valves and/or plasma injectors (e.g., to individual or all of the gas-puff valves and/or plasma injectors or subsets thereof). In addition, different gas-puff valves and/or plasma injectors (or different combinations of multiple gas-puff valves and/or plasma injectors) may be fed by different fill gas mixtures having, for example, different elemental ratios of filling gases and/or different isotopic ratios (e.g., adjustable $D_2/T_2$ molecular ratios). In some embodiments, the gas-puff valves and/or plasma injectors may be uniform (e.g., all of the same type/size with substantially the same operational settings). In other embodiments, different gas-puff valves and/or plasma injectors may be used for different locations. In additional or alternative embodiments, the gas-puff valves and/or plasma injectors may control a flow of gas into the acceleration region 310 via a manifold including multiple ports providing passage into the acceleration region 310. In such embodiments, the ports of the manifold may be uniform or may vary in configuration (e.g., to deliver different amounts of gas to different locations of the acceleration region 310 when a respective gas-puff valve or plasma injector is open).

Similar to neutral gas injection via gas-puff valves, (pre-) ionized gas or plasma may be injected using combinations or manifolds of variously located plasma injectors fluidically coupled to respective plasma generators or guns which generate the plasma prior to injection into the acceleration region 310. In some embodiments, the plasma may be sourced from a gas-injected washer plasma gun and/or a plasma thruster (e.g., a Hall effect thruster or a magnetohydrodynamic thruster), or, if the plasma is magnetized, from a high-power helicon plasma source, a radio frequency plasma source, a plasma torch, and/or a laser-based plasma source. Plasmas formed from gas mixtures may also be created and injected in a manner similar to neutral gas injection. Plasma injection may provide a finer control of an eventual axial plasma distribution as well as a shear flow profile thereof, which in turn may allow for higher fidelity control of plasma stability and lifetime. Additional control of plasma injection may be provided due to the plasma particles being charged particles that may be accelerated by electric fields created by a variable electrical bias (or voltage) on injection electrodes. Thus, a speed of the injected plasma may be finely controlled to allow for fine adjustment and optimization of breakdown of any neutral gas present (e.g., in the acceleration region 310). Moreover, the injected plasma may travel at faster velocities than injected neutral gas, which may travel in a nearly static fashion (relative to the injected plasma) during Z-pinch discharge pulses. As such, relative to neutral gas injection, plasma injection may provide pre-ionized fuel "on demand" (e.g., more immediately), for example, to replenish the fuel gas during Z-pinch discharge pulses.

In some embodiments, the pre-ionized gas may be generated as an unmagnetized plasma, e.g., so as to avoid interaction between a magnetic field of the pre-ionized gas and a magnetic field of the acceleration region 310. In other embodiments, the pre-ionized gas may be generated as a magnetized plasma, e.g., so as to align the magnetic field of the pre-ionized gas to be parallel with the magnetic field of the acceleration region 310 and/or be adjustable to provide a desired magnetic flux profile at an injection point of the pre-ionized gas.

In some embodiments, plasma to be injected into the acceleration region 310 may be generated by pre-ionizing neutral gas with a spark plug or via inductive ionization. More broadly, the gas-puff valves and/or plasma injectors may include one or more electrode plasma injectors and/or one or more electrodeless plasma injectors. In examples wherein the one or more electrode plasma injectors are included, the plasma to be injected into the acceleration region 310 may be generated, at least in part, by electrode discharge. In additional or alternative examples wherein the one or more electrodeless plasma injectors are included, the plasma to be injected into the acceleration region 310 may be generated, at least in part, by inductive discharge produced by an external coil window (e.g., a radio-frequency antenna operating at 400 kHz, 13.56 MHz, 2.45 GHZ, and/or other frequencies permitted for use in a given local jurisdiction, such as within frequency ranges permitted by the Federal Communications Commission). In some embodiments, neutral gas for pre-ionization may be limited by a configuration of a neutral gas reservoir (e.g., a gas source 330) and/or neutral gas conductance to a selected plasma injector configuration.

In some embodiments, axial distribution of the injected plasma may be ensured via an axisymmetric plasma injector configuration. In at least one embodiment, eight plasma injectors may be respectively positioned at eight equally spaced ports of the manifold. The eight ports may each be configured at an oblique angle (e.g., between 5° and 90° with respect to the central axis of the acceleration region 310) with respect to a housing of the acceleration region 310 (e.g., the surrounding outer electrode 304). In one example, the oblique angle may be 45° with respect to the central axis of the acceleration region 310. In some embodiments, the eight ports may be configured at a single axial position along the central axis of the acceleration region 310 (that is, the eight ports may be equally spaced about a circumference or other perimeter of the acceleration region 310 at the axial position). In other embodiments, the ports may include multiple sets of eight ports, with each set of eight ports being equally spaced about a different axial position along the central axis of the acceleration region 310. In an example embodiment, the sets of eight ports may be configured as interleaved pairs of sets, wherein a first set of eight ports may be positioned at a first axial location and a second set of eight ports may be positioned at a second, different axial location and rotated relative to the first set such that each port of the second set is positioned between a pair of ports of the first set with respect to the circumference of the acceleration region 310. Specifically, in such an embodiment, each port of the first set of eight ports may be spaced around the circumference of the acceleration region 310 every 45°, and each port of the second set of eight ports may be spaced around the circumference of the acceleration region 310 every 45° offset (rotated) from the first set of ports by 22.5°, such that one port of the first and second sets is provided around the circumference of the acceleration region 310 every 22.5°. In additional or alternative embodiments, plasma injection may be performed azimuthally, e.g., along a chord perpendicular to the central axis of the acceleration region 310, so as to generate an azimuthal flow within the acceleration region 310. In some embodiments, additional gas-puff valves and/or plasma injectors may be included to allow for injection of more fuel gas (e.g., for longer lasting pinch discharges) and control of an axial pressure distribution of the fuel gas in the acceleration region 310 (e.g., for additional enhancement of the sheared ion velocity flow duration). In additional or alternative embodiments, the valves may be configured differently (e.g., asymmetrically distributed azimuthally and/or with different angular distributions) with other variations to achieve a substantially equivalent profile by compensating for effects of the variations.

In some embodiments, injecting the acceleration region 310 with pre-ionized gas may result in plasmas having a plasma temperature in a range of 1 to 10 eV. The plasma temperature may be decreased (e.g., by reducing an amount of energy input into a process gas used to generate the pre-ionized gas) so as to increase an electrical resistivity of the pre-ionized gas and resulting plasma. Specifically, increasing the electrical resistivity may decrease a tendency of the pre-ionized gas to oppose changes in magnetic flux and thereby a tendency to oppose motion within a magnetic field present in the acceleration region 310.

As noted above, because an injection velocity of pre-ionized gas may be significantly greater than that of neutral gas, a velocity of the plasma within the acceleration region 310 may be up to $50\times10^3$ m/s. In some embodiments, injection of pre-ionized gas may provide flexibility in an amount of particles injected. Specifically, in an example embodiment, an amount of pre-ionized gas particles may be injected in 1/50 of a time utilized to inject the same amount of neutral gas particles. For example, an amount of time utilized to inject 10 Torr-L of neutral gas particles (where 1 Torr-L is proportional to $2.5\times10^{19}$ molecules at 273 K) may be the same amount of time utilized to inject 500 Torr-L of pre-ionized gas particles. Similarly, in some embodiments, an injection rate (or mass flow rate) of pre-ionized gas may be varied according to power supply current and voltage (that is, a waveform of an injection pulse). As an example, increasing the power supply voltage (e.g., to between 100 V and 500 V) may concomitantly increase the injection velocity. As another example, increasing the power supply current (e.g., to between 1 A and 500 A) may concomitantly increase the injection rate. In some embodiments, the power supply voltage may be increased to between 750 V and 5 kV.

As discussed above, the gas-puff valves and/or plasma injectors may be activated either individually or in groups. An initial gas load inside the acceleration region 310 having desired axial and azimuthal profiles may be achieved by timing individual valves and/or groups of valves. Such valves (or groups thereof) may be timed in a fashion to align an arrival of the neutral and/or pre-ionized gas and/or mixtures thereof to a desired initial profile. Power supplies (e.g., power supplies 314 and 315 or separate, dedicated power supplies) may be timed to achieve ionization at a desired axial location and utilize the initial gas load to produce and sustain the sheared flow. In some embodiments, the power supplies may include a capacitor bank and a switch. In other embodiments, other suitable types of power supplies may be used, including flywheel power supplies.

Various combinations of (neutral gas) gas-puff valves with plasma injectors may be activated to achieve a desired level of power output. Moreover, plasma may be injected into the acceleration region 310 significantly (e.g., ~100×) faster than puffed neutral gas. A combination of such different injection speeds allowed by acceleration of plasma injection with neutral gas injection provides an even larger parameter space for optimization. Additionally, plasma injectors may serve to inject mass and precisely control locations of neutral gas ionization.

In an example embodiment, the first power supply 314 and the second power supply 315 may take the form of respective capacitor banks each capable of storing up to 10 MJ (e.g., 0.1 to 10 MJ). In one such embodiment, the first power supply 314 and the second power supply 315 may take the form of respective capacitor banks capable of storing up to 100-200 kJ and 3-4 MJ, respectively.

The plasma confinement system 300 may include the gas source 330 (e.g., a pressurized storage tank) and one or more first regulators 332 respectively configured to control gas flow from the gas source 330 through the one or more first valves 306. Respective couplings (e.g., piping) between the one or more first regulators 332 and the one or more first valves 306 are omitted in FIG. 1 for clarity.

Similarly, the plasma confinement system 300 may include one or more second regulators 334 respectively configured to control gas flow from the gas source 330 through the one or more second valves 312. Respective couplings (e.g., piping) between the one or more second regulators 334 and the one or more second valves 312 are omitted in FIG. 1 for clarity.

In some embodiments, the plasma confinement system 300 may include a first insulator 336 (e.g., having an annular cross section) between the inner electrode 302 and the outer electrode 304 to maintain electrical isolation between the inner electrode 302 and the outer electrode 304. In other embodiments, such as when the inner electrode 302 is at least partially surrounded by the intermediate electrode 303, the first insulator 336 may be positioned between the inner electrode 302 and the intermediate electrode 303 to maintain electrical isolation between the inner electrode 302 and the intermediate electrode 303. In an example embodiment, the first insulator 336 may be formed from an electrically insulating material such as a glass, a ceramic, or a glass-ceramic material. In some embodiments, one or more valves (e.g., gas-puff valves and/or plasma injectors) may extend through or be provided in place of the first insulator 336 to inject neutral gas and/or pre-ionized gas at an end of the acceleration region 310 opposite to the first end 318 of the inner electrode 302.

Similarly, the plasma confinement system 300 may include a second insulator 337 (e.g., having an annular cross section) between the intermediate electrode 303 and the outer electrode 304 to maintain electrical isolation between the intermediate electrode 303 and the outer electrode 304. In an example embodiment, the second insulator 337 may be formed from an electrically insulating material such as a glass, a ceramic, or a glass-ceramic material.

The plasma confinement system 300 may include a vacuum chamber 338 that at least partially surrounds the inner electrode 302, the intermediate electrode 303, and/or the outer electrode 304. In the example embodiment depicted in FIG. 1, the vacuum chamber 338 entirely surrounds each of the inner electrode 302, the intermediate electrode 303, and the outer electrode 304 (and thereby the plasma confinement chamber 340). In an example embodiment, the vacuum chamber 338 may be formed as a stainless steel pressure vessel. In some embodiments, a pressure inside the vacuum chamber 338 may range from $10^{-9}$ Torr to 20 Torr (e.g., $10^{-9}$ Torr to $10^{-3}$ Torr).

The plasma confinement system 300 may include a controller or other computing device 348, which may include non-transitory memory on which executable instructions may be stored. The executable instructions may be executed by one or more processors of the controller 348 to perform various functionalities of the plasma confinement system 300. Accordingly, the executable instructions may include various routines for operation, maintenance, and testing of the plasma confinement system 300. The controller 348 may further include a user interface at which an operator of the plasma confinement system 300 may enter commands or otherwise modify operation of the plasma confinement system 300. The user interface may include various components for facilitating operator use of the plasma confinement system 300 and for receiving operator inputs (e.g., requests to generate plasma arcs for thermonuclear fusion, etc.), such as one or more displays, input devices (e.g., keyboards, touchscreens, computer mice, depressible buttons, mechanical switches other mechanical actuators, etc.), lights, etc. The controller 348 may be communicably coupled to various components (e.g., valves, power supplies, etc.) of the plasma confinement system 300 to command actuation and use thereof (wired and/or wireless communication paths between the controller 348 and the various components are omitted from FIG. 1 for clarity).

Referring now to FIGS. 2-3F, operational aspects of a plasma confinement system, such as the plasma confinement system 300 described in detail above with reference to FIG. 1, are illustrated. Specifically, in FIG. 2, a block diagram of a method 200 for operating the plasma confinement system is shown, and, in FIGS. 3A-3F, schematic cross-sectional diagrams of a portion 350 of the plasma confinement system 300 of FIG. 1 and functionality thereof are respectively shown. Accordingly, FIGS. 1 and 3A-3F, viewed together, illustrate at least some of the aspects of the method 200 as described below. In an example embodiment, operation of the plasma confinement system (e.g., the plasma confinement system 300) may include initiating and driving a sheared ion velocity flow therein for stabilization of Z-pinch discharge.

In some embodiments, the method 200, or a portion thereof, may be implemented as executable instructions stored in non-transitory memory of a computing device, such as a controller communicably coupled to the plasma confinement system. Moreover, in certain embodiments, additional or alternative sequences of steps may be implemented as executable instructions on such a computing device, where individual steps discussed with reference to the method 200 may be added, removed, substituted, modified, or interchanged.

At block 902, the method 200 may include directing gas, via one or more first valves, from within an inner electrode to an acceleration region of a plasma confinement chamber. In an example embodiment, the acceleration region may be located between the inner electrode and an outer electrode that substantially surrounds the inner electrode. In other embodiments, the acceleration region may be located between the inner electrode and an intermediate electrode that substantially surrounds the inner electrode, the outer electrode substantially surrounding the intermediate electrode.

Figure 3A:
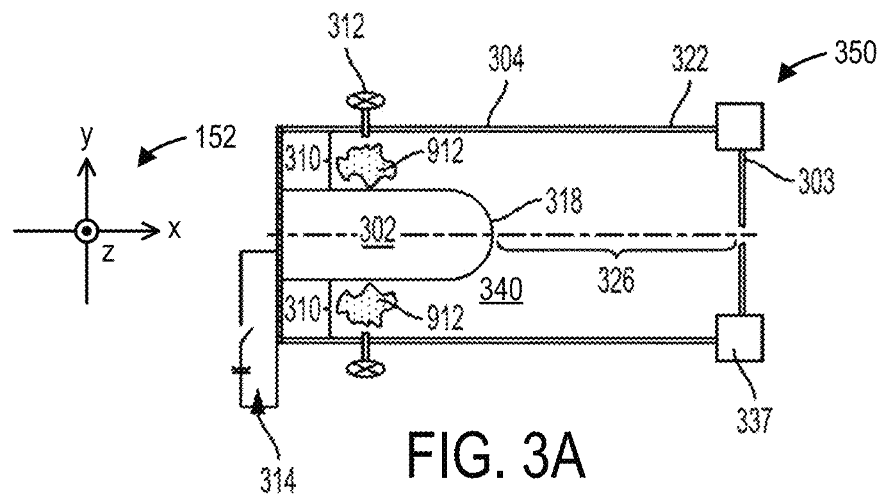
FIGS. 3A-3F show schematic cross-sectional diagrams of a process of initiating and driving a sheared ion velocity flow in the plasma confinement system of FIG. 1 for stabilization of a Z-pinch discharge, in accordance with at least one embodiment.
Figure 3B:
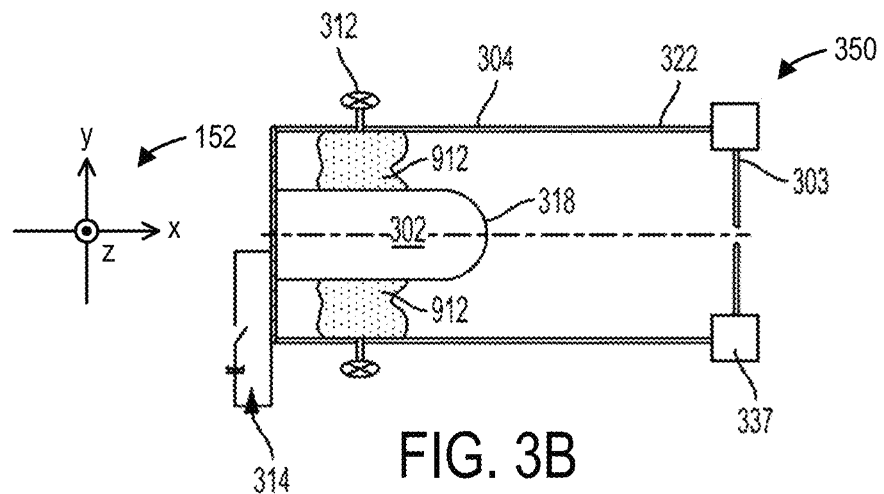

For example, and as shown in FIGS. 3A and 3B, the one or more first valves 306 may direct a gas 912 from within the inner electrode 302 to the acceleration region 310 between the inner electrode 302 and the outer electrode 304 that substantially surrounds the inner electrode 302. Specifically, FIG. 3A illustrates an initial amount of the gas 912 entering the acceleration region 310 and FIG. 3B illustrates an additional amount of the gas 912 entering the acceleration region 310. As shown in FIG. 3A, the acceleration region 310 may be included, along with the assembly region 326, in the plasma confinement chamber 340.

In some embodiments, directing the gas 912 via the one or more first valves 306 may include providing (e.g., via a power supply such as a capacitor bank that is not shown at FIGS. 3A-3F) a first valve voltage to the one or more first valves 306 (e.g., to control terminals of the one or more first valves 306) followed by providing a second valve voltage (e.g., via a DC power supply) to the one or more first valves 306. In an example embodiment, the first valve voltage may be greater than the second valve voltage and the second valve voltage may be provided immediately (e.g., substantially immediately) after providing the first valve voltage.

At block 904, the method 200 may include directing gas, via one or more second valves, from outside the outer electrode to the acceleration region.

For example, and as shown in FIGS. 3A and 3B, the one or more second valves 312 may direct a portion of the gas 912 into the acceleration region 310.

In some embodiments, directing the gas 912 via the one or more second valves 312 may include providing (e.g., via a power supply such as a capacitor bank that is not shown) a third valve voltage to the one or more second valves 312 (e.g., to control terminals of the one or more second valves 312) followed by providing a fourth valve voltage (e.g., via a DC power supply) to the one or more second valves 312. In an example embodiment, the third valve voltage may be greater than the fourth valve voltage and the fourth valve voltage may be provided immediately (e.g., substantially immediately) after providing the third valve voltage.

After operation of the one or more first valves 306 and the one or more second valves 312, a gas pressure at, e.g., directly adjacent to (upon release) or within (such as within a plenum of, when present), each of the one or more first valves 306 and the one or more second valves 312 may be up to 5800 Torr, such as within a range of 1000 to 5800 Torr (e.g., 5450 to 5550 Torr), prior to applying a voltage between the inner electrode 302 and the outer electrode 304 via the first power supply 314. Correspondingly, after operation of the one or more first valves 306 and the one or more second valves 312, a gas pressure within the acceleration region 310 may be up to 5800 Torr, such as within the range of 1000 to 5800 Torr (e.g., 5450 to 5550 Torr), prior to applying the voltage between the inner electrode 302 and the outer electrode 304 via the first power supply 314. In an example embodiment, the gas pressure within the acceleration region 310 may decrease with increasing distance from a point of gas insertion and with passage of time after gas is no longer introduced to the acceleration region 310.

At block 906, the method 200 may include applying, via a first power supply, a voltage between the inner electrode and the outer electrode to convert at least a portion of the directed gas into a plasma having a substantially annular cross section, the plasma flowing axially within the acceleration region toward a first end of the inner electrode and a first end of the outer electrode.

Figure 3C:
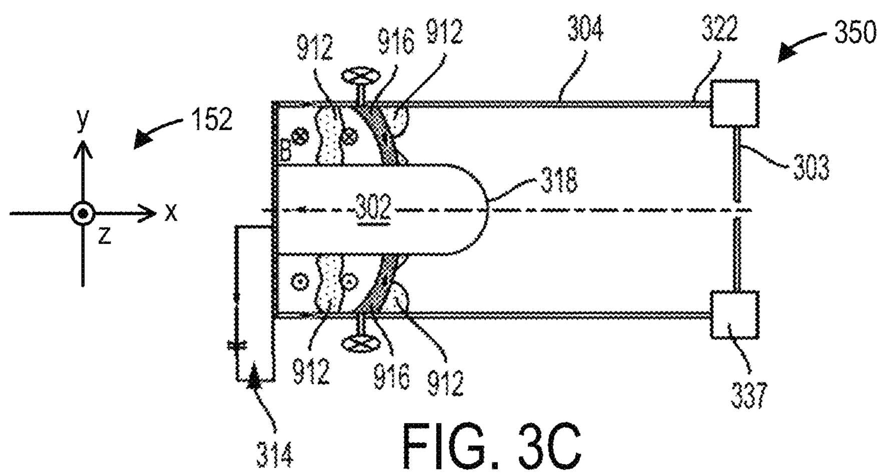
Figure 3D:
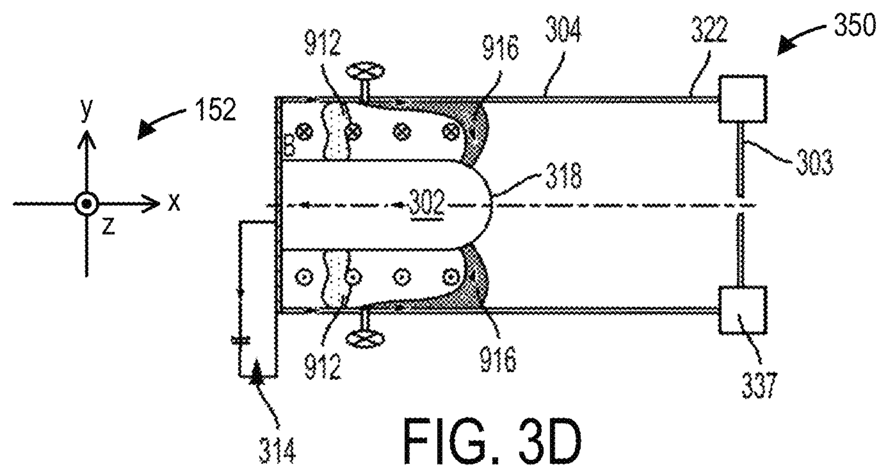

For example, and as shown in FIGS. 3C and 3D, the first power supply 314 may apply the voltage between the inner electrode 302 and the outer electrode 304 to convert at least a portion of the gas 912 into a plasma 916 having a substantially annular cross section. The voltage applied by the first power supply 314 between the inner electrode 302 and the outer electrode 304 may result in a radial electric field within the acceleration region 310 up to 500 kV/m (e.g., within a range of 30 kV/m to 500 kV/m). Due to a magnetic field being generated by a current traveling through the plasma 916, the plasma 916 may flow axially within the acceleration region 310 toward the first end 318 of the inner electrode 302 and the first end 322 of the outer electrode 304 (as shown in FIGS. 3C and 3D).

At block 908, the method 200 may include applying, via a second power supply, a voltage between the inner electrode and the intermediate electrode to establish a plasma arc (e.g., a Z-pinch plasma) that flows between the intermediate electrode and the first end of the inner electrode. In an example embodiment, the intermediate electrode may be positioned at a first end of the outer electrode. In other embodiments, and as discussed above, the intermediate electrode may substantially surround the inner electrode, and the outer electrode may substantially surround the intermediate electrode.

Figure 3E:
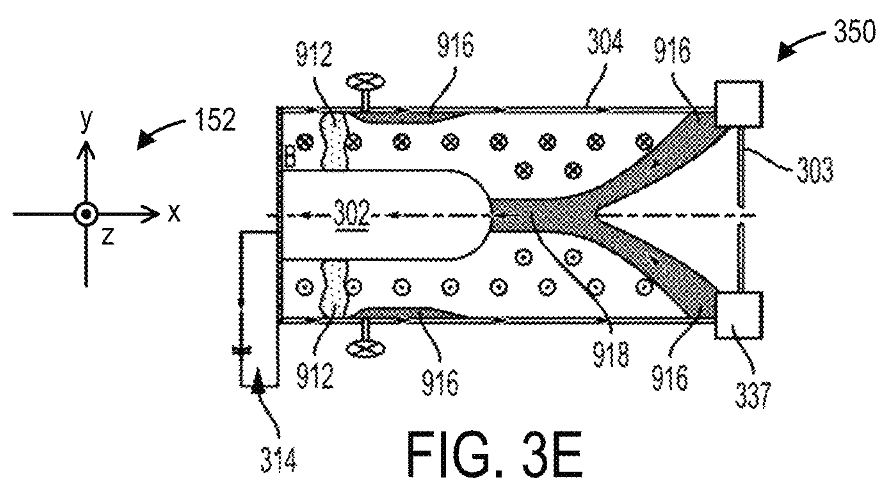
Figure 3F:
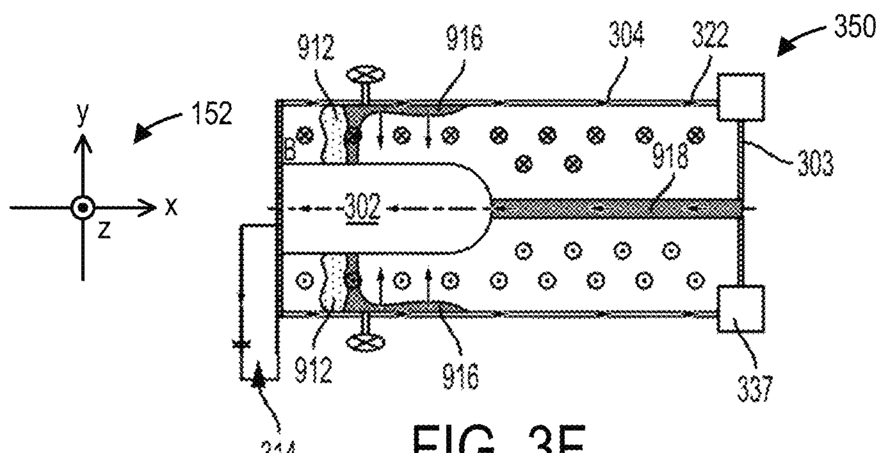

For example, and as shown in FIGS. 3E and 3F, the second power supply (e.g., the second power supply 315 as described in detail above with reference to FIG. 1; omitted in FIGS. 3A-3F for clarity) may apply a voltage between the inner electrode 302 and the intermediate electrode 303 to confine the plasma 916 and establish a plasma arc 918 (also referred to herein as a Z-pinch plasma 918) that flows between the intermediate electrode 303 and the first end 318 of the inner electrode 302. As shown, the plasma arc 918 may be established when the plasma 916 moves beyond the acceleration region 310. Specifically, the plasma arc 918 may flow into the assembly region 326 between the first end 318 of the inner electrode 302 and the intermediate electrode 303. In some embodiments, such as when the inner electrode 302 functions as a cathode and the intermediate electrode 303 functions as an anode, each of a discharge current forming the plasma arc 918 and a sheared axial (ion velocity) flow stabilizing the discharge current may flow from the first end 318 of the inner electrode 302 to the intermediate electrode 303. In other embodiments, such as when the inner electrode 302 functions as the anode and the intermediate electrode 303 functions as the cathode, the discharge current may flow from the intermediate electrode 303 to the first end 318 of the inner electrode 302 and the sheared axial flow may flow from the first end 318 of the inner electrode 302 to the intermediate electrode 303. In some embodiments, to augment the sheared flow profile created by neutral gas injection, injection of pre-ionized gas using plasma injectors, plasma guns, or ion sources may be employed in conjunction. In such embodiments, accordingly, plasma injection may occur rapidly and on the same scale as the blocks 902 and 904, and may be used to control formation/initialization and dynamics of the plasma arc 918.

In an example embodiment, the plasma arc 918 may exhibit the sheared axial flow and have a radius up to 5 mm (e.g., between 0.05 and 5 mm), an ion temperature up to 100000 eV, such as between 900 and 30000 eV (e.g., 900 to 2000 eV), an electron temperature greater than 500 eV, an ion number density greater than $1\times10^{23}$ ions/m$^3$ and/or an electron number density greater than $1\times10^{23}$ electrons/m$^3$, and/or a magnetic field over 8 T, and/or may be stable for at least 1 μs, such as between 5 and 10 μs or up to 1 ms. It should be noted that such ranges are exemplary and may be modified based on an operating mode of the plasma confinement system 300 or based on modifications to a size, function, configuration, etc. of the plasma confinement system 300. For example, if the size of the plasma confinement system 300 increases, such ranges may scale proportionally (e.g., linearly, exponentially, etc.).

It should be noted that the blocks 906 and 908 may be implemented by other means of controlling (a) the voltage between the inner electrode 302 and the outer electrode 304 and (b) the voltage between the inner electrode 302 and the intermediate electrode 303, as one of skill in the art will recognize. For example, a power supply may provide a voltage between the intermediate electrode 303 and the outer electrode 304, instead of between the inner electrode 302 and the intermediate electrode 303.

Figure 4:
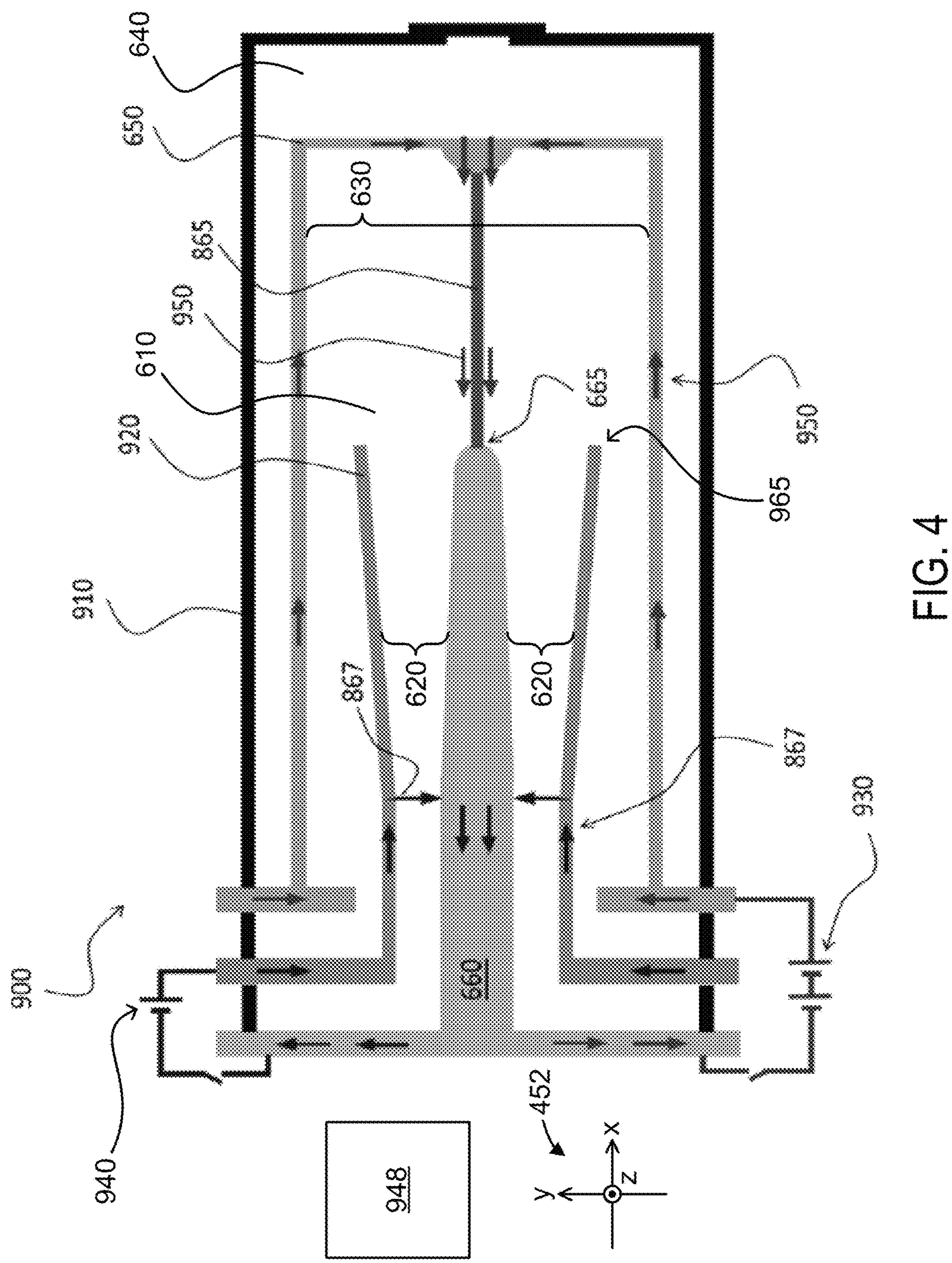
FIG. 4 shows a schematic cross-sectional diagram of a plasma confinement system, in accordance with at least one embodiment.

Referring now to FIG. 4, a schematic cross-sectional diagram of a plasma confinement system 900, such as may be included within a thermonuclear fusion energy system, device, reactor, or other such apparatus or system, is shown. The plasma confinement system 900 may generate a plasma arc 865 within an assembly region 630 of a plasma confinement chamber 610, the plasma arc 865 confined, compressed, and sustained by an axially symmetric magnetic field. The axially symmetric magnetic field may be stabilized by a sheared ion velocity flow driven by electrical discharge between a pair of electrodes interfacing with the plasma confinement chamber 610.

The plasma confinement system 900 may be assembled and configured similarly to the plasma confinement system 300 and may operate in a substantially similar manner in practice. The primary differences between the plasma confinement system 300 as depicted in FIG. 1 and the plasma confinement system 900 as depicted in FIG. 4 include relative positioning and spatial configuration of the intermediate electrode 303 (in FIG. 1) and relative positioning and spatial configuration of an intermediate electrode 920 (in FIG. 4), which will be discussed in greater detail below. Excepting certain assembly and operational aspects which may arise from such differences, the description provided above with reference to FIGS. 1-3F may be additionally applied to the embodiment depicted in FIG. 4. In certain embodiments, additional subsystems and/or functionalities may also be included in the plasma confinement system 900 which were not described in detail above with reference to FIGS. 1-3F and which may be additionally applied to the embodiments depicted in FIGS. 1-3F.

A set of Cartesian coordinate axes 452 is shown in FIG. 4 for contextualizing positions of the various components of the plasma confinement system 900. Specifically, x-, y-, and z-axes are provided which are mutually perpendicular to one another, where the x- and y-axes define a plane of the schematic cross-sectional diagram shown in FIG. 4 and the z-axis is perpendicular thereto. In some embodiments, a direction of gravity may be parallel to and coincident with any direction in the plane of the schematic cross-sectional diagram of FIG. 4. For example, the direction of gravity may be parallel and coincident with a positive direction of the x-axis. In additional or alternative embodiments, the direction of gravity may be within a plane defined by the y- and z-axes (e.g., parallel and coincident with a negative direction of the y-axis).

In an example embodiment, the plasma confinement system 900 may include an outer electrode 650 separated physically and functionally from an external vacuum boundary 910, the external vacuum boundary 910, together with portions of an inner electrode 660, forming a vacuum vessel 640 as a low pressure container including the plasma confinement chamber 610. The intermediate electrode 920 may be positioned so as to have a radius in between a radius of the inner electrode 660 and a radius of the outer electrode 650. Specifically, the intermediate electrode 920 may substantially surround the inner electrode 660 and the outer electrode 650 may substantially surround the intermediate electrode 920. For example, the inner electrode 660 may include one end 665 that is at least partially surrounded by the intermediate electrode 920 and the intermediate electrode 920 may include one end 965 that is at least partially surrounded by the outer electrode 650.

The plasma confinement system 900 may incorporate at least two functionally separate power supplies, e.g., at least one primary power supply 930 primarily arranged and controlled to drive a Z-pinch (discharge) current 950 ($I_{pinch}$), and at least one additional power supply 940 primarily arranged and controlled to drive a residual current 867. In some embodiments, the at least one primary power supply 930 may be separate power supply device(s) from the at least one additional power supply 940. In other embodiments, the at least one primary power supply 930 and the at least one additional power supply 940 may be components of the same power supply device.

For example, in at least one embodiment, a single power supply device may have a plurality of outputs which individually provide an amount of power to enable performance of a respective function (e.g., drive the Z-pinch current 950, drive the residual current 867, etc.). Such an arrangement may be based on at least two power supplies (e.g., one primary power supply 930 and one additional power supply 940) and may allow for additional control of the Z-pinch current 950 and sheared flow stabilization thereof. In principle, the at least two power supplies may be scaled, charged, and controlled such that the Z-pinch current 950 and the stabilization thereof may be maintained for commensurate time periods before any of the at least two power supplies prematurely runs short or out of stored energy.

In certain embodiments, the plasma confinement system 900 may incorporate a "tapered electrodes" configuration, characterized by broadening a gap between the inner electrode 660 and the intermediate electrode 920 by tapering, along the x-axis, the end 965 of the intermediate electrode 920 outwards to increase a volume of at least a portion of the acceleration region 620, e.g., in a direction of the (unsupported) ends 665 and 965. In one example, the taper may be between 0 and 15 degrees from a central axis of the plasma confinement system 900 (e.g., parallel to the x-axis). Such an arrangement may facilitate a transfer of momentum from plasma heated by the residual current 867 to neutral gas, e.g., along a positive direction of the x-axis, thereby creating and sustaining sheared flow stabilization. The momentum transfer may be described and modeled using methodology applicable to design/optimization of "de Laval nozzles" as known in the field of jet propulsion.

While techniques described herein are discussed in connection with thermonuclear fusion and, for example, harnessing energy production therefrom, the techniques described herein can be used for other purposes, such as heat generation (e.g., for manufacturing utilizing relatively high temperatures) and propulsion. For example, the plasma confinement system 300 of FIG. 1 or the plasma confinement system 900 of FIG. 4 may be modified at least by removing the vacuum chamber 338 or the external vacuum boundary 910, respectively, and introducing an opening in one end of the outer electrode 650 to allow fusion products to escape (e.g., parallel to the x-axis). In certain embodiments, a magnetic nozzle (not shown at FIG. 4) may be positioned downstream of the outer electrode 650, e.g., to the right of the outer electrode 650 with respect to the x-axis, to collimate the plasma to reduce any exhaust plume divergence.

The plasma confinement system 900 may include a controller or other computing device 948, which may include non-transitory memory on which executable instructions may be stored. The executable instructions may be executed by one or more processors of the controller 948 to perform various functionalities of the plasma confinement system 900. Accordingly, the executable instructions may include various routines for operation, maintenance, and testing of the plasma confinement system 900. The controller 948 may further include a user interface at which an operator of the plasma confinement system 900 may enter commands or otherwise modify operation of the plasma confinement system 900. The user interface may include various components for facilitating operator use of the plasma confinement system 900 and for receiving operator inputs (e.g., requests to generate plasma arcs for thermonuclear fusion, etc.), such as one or more displays, input devices (e.g., keyboards, touchscreens, computer mice, depressible buttons, mechanical switches or other mechanical actuators, etc.), lights, etc. The controller 948 may be communicably coupled to various components (e.g., valves, power supplies, etc.) of the plasma confinement system 900 to command actuation and use thereof (wired and/or wireless communication paths between the controller 948 and the various components are omitted from FIG. 4 for clarity).

Figure 5:
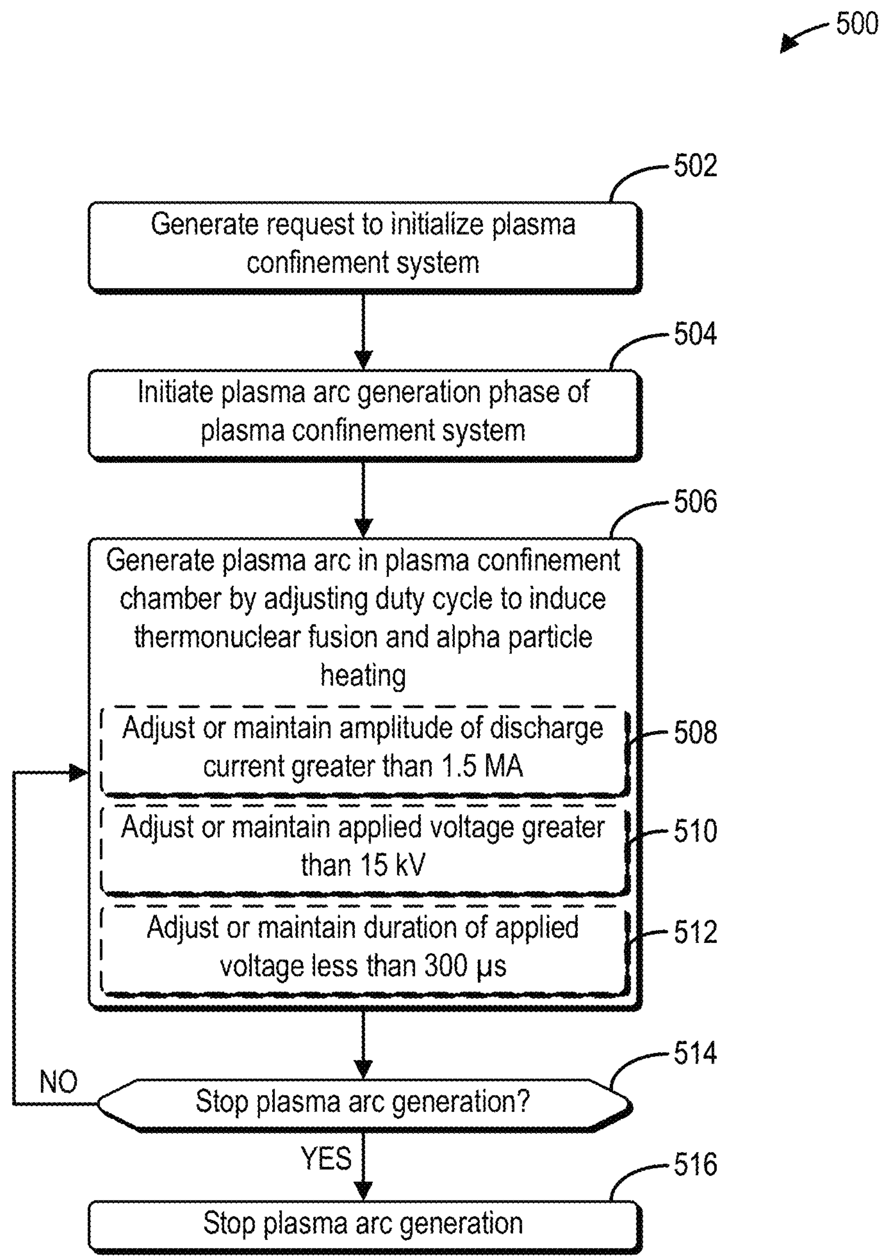
FIG. 5 shows a block diagram of a method for operating a plasma confinement system, in accordance with at least one embodiment.

Referring now to FIG. 5, a block diagram of a method 500 for operating a plasma confinement system, such as any of the plasma confinement systems described in detail above with reference to FIGS. 1-4, by adjusting one or more operating parameters to account for collisions between fusion byproducts and a fuel gas is shown. In an example embodiment, the fusion byproducts may include $^4$He and the fuel gas may include deuterium- and/or tritium-containing species (such as $D_2$ and/or $T_2$), $^3$He, $^6$Li, $^{11}$B, etc. In such an embodiment and in certain other embodiments described herein, additional thermal energy originating from the collisions may be referred to as "alpha energy," "alpha particle energy," or "alpha particle heating." Alpha particle heating, when induced or increased by the adjustments to the one or more operating parameters, may increase an energy output of the plasma confinement system and thereby a fusion energy gain factor.

In some embodiments, the method 500, or a portion thereof, may be implemented as executable instructions stored in non-transitory memory of a computing device, such as a controller communicably coupled to the plasma confinement system. Moreover, in certain embodiments, additional or alternative sequences of steps may be implemented as executable instructions on such a computing device, where individual steps discussed with reference to the method 500 may be added, removed, substituted, modified, or interchanged.

At block 502, the method 500 may include generating a request to initialize the plasma confinement system, according to which an initialization phase of the plasma confinement system may be initiated. In an example embodiment, the request may be generated responsive to receiving a user input, e.g., from an operator of the plasma confinement system. For instance, initialization of the plasma confinement system may be triggered or otherwise initiated via an operator interacting with a user interface, e.g., a push button switch, toggle switch, or other mechanical actuator, a keyboard, a touchscreen, a cursor input, etc.

At block 504, the method 500 may include initiating a plasma arc generation phase of the plasma confinement system, e.g., following the initialization phase. Specifically, in an example embodiment, the plasma arc generation phase may be initiated at least by powering up the plasma confinement system (e.g., one or more power supplies may supply power to various components utilized during the plasma arc generation phase) and providing the fuel gas for forming a plasma to the plasma confinement chamber by increasing one or more valve openings.

At block 506, the method 500 may include generating the plasma arc in the plasma confinement chamber, e.g., during the plasma arc generation phase, by adjusting a duty cycle of a discharge current applied to the fuel gas to induce thermonuclear fusion and alpha particle heating. Specifically, by adjusting the duty cycle, a magnetic field applied to compress the fuel gas within the plasma confinement chamber may be adjusted to induce or increase the thermal collisions (e.g., at or above a threshold amount, such as an amount commanded by an operator of the plasma confinement system). In an example embodiment, the duty cycle (and thereby the applied magnetic field) may be adjusted so as to increase alpha particle heating relative to energy generated via thermonuclear fusion and thereby increase an efficiency of an energy output of the plasma confinement system. As an example, an amplitude of a discharge current may be increased while a pulse duration of the discharge current is decreased so as to maintain the energy output yet increase a proportion of the energy output which may be ascribed to alpha particle heating (cf., e.g., plot 601 to plot 603 in FIG. 6, as described in greater detail below). As another example, the amplitude of the discharge current may be increased while maintaining or increasing the pulse duration of the discharge current so as to increase the energy output and thereby increase the fusion energy gain factor (cf., e.g., plot 601 to plot 602 in FIG. 6, as described in greater detail below). In some embodiments, and as discussed in detail below with reference to FIG. 8, the fusion energy gain factor may be increased to at least $10^2$ by adjusting the duty cycle to capture thermal energy from increased thermal collisions between the fusion byproducts and the fuel gas (e.g., alpha particle heating). Moreover, as the magnetic field increases in strength from a first intensity value to a second intensity value (e.g., by increasing the amplitude of the discharge current), compression of the generated plasma arc may result in a concomitant increase in the plasma density. As discussed in detail below with reference to FIG. 9, greater thermal energy from increased thermal collisions between the fusion byproducts and the fuel gas (e.g., alpha particle heating) may result from the increased plasma density. Accordingly, when the magnetic field is adjusted from the first intensity value (e.g., applied to axially compress the fuel gas to generate the plasma arc) to a second intensity value, greater thermal collisions between the fusion byproducts and the fuel gas may result than when the magnetic field is at the first intensity value.

To access an operational regime in which alpha particle heating occurs, the duty cycle may be adjusted by adjusting one or more of the amplitude of the discharge current, the applied voltage inducing the discharge current, and the pulse duration of the discharge current. Specifically, at dashed block 508, adjusting the duty cycle may include adjusting (e.g., increasing) or maintaining the amplitude of the discharge current greater than 1.5 MA. For example, the amplitude of the discharge current may be adjusted (e.g., increased) or maintained between 1.5 MA and 2.0 MA. Additionally or alternatively, at dashed block 510, adjusting the duty cycle may include adjusting (e.g., increasing) or maintaining the applied voltage greater than 15 kV. For example, the applied voltage may be adjusted (e.g., increased) or maintained between 15 kV and 75 kV. Additionally or alternatively, at dashed block 512, adjusting the duty cycle may include adjusting (e.g., decreasing) or maintaining the pulse duration of the discharge current less than 300 μs. For example, the pulse duration of the discharge current may be adjusted (e.g., decreased) or maintained between 15 μs and 300 μs.

It should be noted that the dashing of the dashed blocks 508, 510, and 512 indicates that corresponding method steps (or a portion of such method steps) may be optional in the method 500 in certain embodiments. For example, in certain embodiments the pulse duration of the discharge current may be maintained above 300 μs throughout operation of the plasma confinement system.

At block 514, the method 500 may include determining whether to stop the plasma arc generation, e.g., according to a request generated at the plasma confinement system. If no stopping of the plasma arc generation is indicated, the method 500 may return to the block 506 to continue generating the plasma arc in the plasma confinement chamber.

If stopping plasma arc generation is indicated, the method 500 may proceed to block 516, where the method 500 may include stopping plasma arc generation (e.g., ending the plasma arc generation phase). Specifically, the discharge current may cease being applied to the plasma and the one or more valve openings may be decreased or altogether closed to reduce or cease supplying the fuel gas to the plasma confinement chamber, such that the plasma arc may become unsustainable and cease.

In at least one embodiment, the plasma confinement system may be a Z-pinch plasma confinement system. In Z-pinch plasma confinement, the applied magnetic field may compress the fuel gas along an axis (e.g., a linear axis denoted by z, hence "Z"-pinch) so as to confine, stabilize, and maintain the plasma arc. In additional or alternative embodiments, the magnetic field may be stabilized throughout the plasma arc generation phase (and thus throughout the adjustment of the magnetic field to induce or increase thermal collisions, e.g., between the fusion byproducts and the fuel gas) by a sheared ion velocity flow driven by the discharge current (also referred to herein as a "Z-pinch discharge current" when discussed in the context of Z-pinch plasma confinement). As a result of relatively high stability and strength of the magnetic field, and as discussed in detail below with reference to FIG. 7, the alpha particles may be retained by the magnetic field with little or no dependency on initial velocities of the alpha particles. Thus, relative to certain other plasma confinement configurations, more alpha particles may be retained for subsequent thermal collisions in Z-pinch plasma confinement configurations (especially when the discharge current is relatively high, e.g., greater than 1.5 MA).

Figure 6:
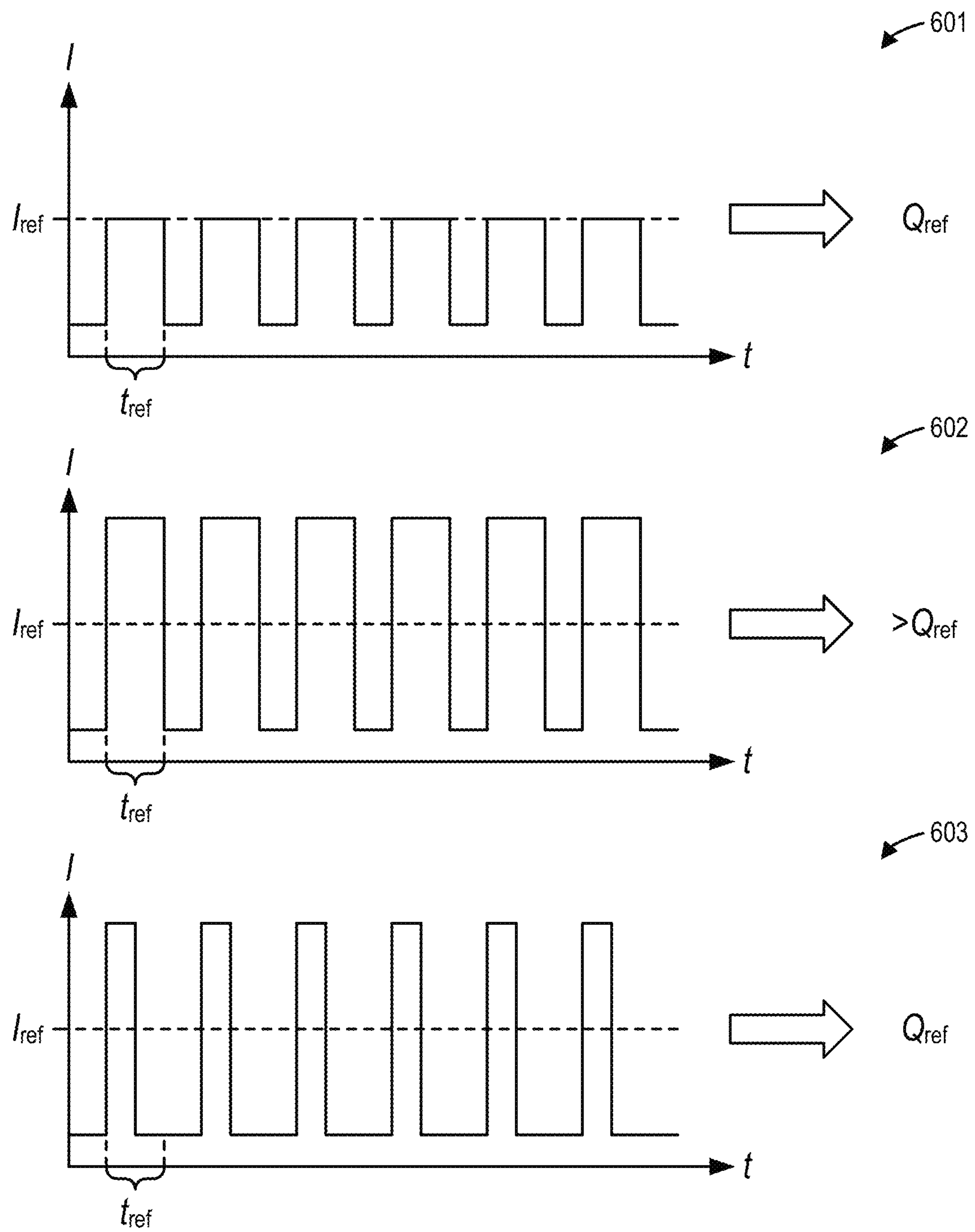
FIG. 6 shows prophetic plots of exemplary duty cycles for discharging current during operation of a plasma confinement system, in accordance with at least one embodiment.

Referring now to FIG. 6, plots 601, 602, and 603 of exemplary duty cycles for discharging a current I during operation of a plasma confinement system, such as any of the plasma confinement systems described in detail above with reference to FIGS. 1-4, are shown. In each of the plots 601, 602, and 603, an abscissa indicates a time t (in arbitrary units) and an ordinate indicates the current I (in arbitrary units). Each of the exemplary duty cycles may be discussed in the context of current pulses of an amplitude $I_{ref}$ and a pulse duration $t_{ref}$, as well as a fusion energy gain factor $Q_{ref}$ of the plasma confinement system. Specifically, $I_{ref}$ and $t_{ref}$ respectively characterize the amplitude and the pulse duration of the exemplary duty cycle depicted in the plot 601 and $Q_{ref}$ characterizes the fusion energy gain factor resulting from application of the exemplary duty cycle depicted in the plot 601.

Respective comparisons between the exemplary duty cycle depicted in the plot 601 and the exemplary duty cycles depicted in the plots 602 and 603 indicate a flexibility which may be attained by accessing a regime of alpha particle heating. As an example of such flexibility, and as indicated by comparing the exemplary duty cycles of the plots 601 and 602, the amplitude of the current pulse may be increased beyond $I_{ref}$ so as to induce or increase alpha particle heating and thereby increase $Q_{ref}$. As another example of such flexibility, and as indicated by comparing the exemplary duty cycles of the plots 601 and 603, the amplitude of the current pulse may be increased beyond $I_{ref}$ while the pulse duration of the current pulse may be decreased below $t_{ref}$ so as to induce or increase alpha particle heating while maintaining $Q_{ref}$. Though each of the exemplary duty cycles of the plots 601 and 603 may result in the same fusion energy gain factor ($Q_{ref}$), the exemplary duty cycle of the plot 603 may access greater thermal energy from increased thermal collisions between fusion byproducts and a fuel gas (e.g., alpha particle heating) and thus may be more efficient in terms of energy output (e.g., a greater proportion of the energy output of the plasma confinement system may be ascribed to alpha particle heating when the exemplary duty cycle of the plot 603 is requested relative to when the exemplary duty cycle of the plot 601 is requested). That is, the exemplary duty cycle depicted in the plot 603 may allow a plasma confinement system which may not be able to harness an energy output for a fusion energy gain factor greater than $Q_{ref}$ (e.g., the fusion energy gain factor generated via the exemplary duty cycle of the plot 602) to take advantage of alpha particle heating to increase efficiency of operation.

Accordingly, when a duty cycle is adjusted, $Q_{ref}$ may change (or not change) responsive to how an area under a time curve of the duty cycle changes (or does not change). As an example, if an area under a time curve of a duty cycle is increased, $Q_{ref}$ may increase (cf., e.g., the plots 601 and 602). As another example, if an area under a time curve of a duty cycle is decreased, $Q_{ref}$ may decrease. As yet another example, if an area under a time curve of a duty cycle is maintained, $Q_{ref}$ may be maintained (cf., e.g., the plots 601 and 603).

Referring now to FIG. 7, plots 701, 702, and 703 of exemplary trajectories of alpha particles axially confined (e.g., along an axis z) within a magnetic field generated by a plasma confinement system are shown. Specifically, the plasma confinement system corresponding to the plots 701, 702, and 703 is a Z-pinch plasma confinement system, such as any of the plasma confinement systems described in detail above with reference to FIGS. 1-4. In each of the plots 701, 702, and 703, an abscissa indicates distance along the axis z (in arbitrary units) and an ordinate indicates distance along an axis y (in arbitrary units), each of the axes y and z being perpendicular to one another and scaled by a scaling factor a. As indicated by comparing initial velocities 711, 712, and 713 of the exemplary trajectories depicted in the plots 701, 702, and 703, respectively, in a Z-pinch plasma confinement system, alpha particles may be axially confined by a sufficiently strong magnetic field (e.g., induced by a sufficiently strong discharge current) substantially regardless of (e.g., independent from) a direction of initial velocity and/or a magnitude of initial velocity (e.g., a magnitude of a component of initial velocity along a given axis). Accordingly, larger proportions of thermal energy generated by collisions of the alpha particles with a fuel gas may be expected for Z-pinch plasma confinement configurations than certain other plasma confinement configurations.

Referring now to FIG. 8, a composite plot 800 of expected fusion energy gain factors $Q_{fus}$ (curve 802) and $Q_{fus,heat}$ (curve 801) generated by a plasma arc confined within a plasma confinement system, such as any of the plasma confinement systems described in detail above with reference to FIGS. 1-4, and a plasma temperature (curve 803), a plasma density (curve 804; also referred to herein as "number density" or "ion number density"), and a pinch radius of the confined plasma arc (curve 805) as a function of a pinch current is shown. In the composite plot 800, an abscissa indicates the pinch current (in kA), a left ordinate indicates the fusion energy gain factors $Q_{fus}$ and $Q_{fus,heat}$ (unitless quantities), and, from left to right, a first right ordinate indicates the plasma temperature (in keV), a second right ordinate indicates the plasma density (in $10^{20}$ $cm^{-3}$), and a third right ordinate indicates the pinch radius (in mm). In the depicted example, the fusion energy gain factor $Q_{fus}$ is determined without accounting for alpha particle heating in the plasma confinement system and the fusion energy gain factor $Q_{fus,heat}$ is determined by accounting for the alpha particle heating. As shown in the composite plot 800, the fusion energy gain factor $Q_{fus}$ reaches an upper limit 806 (e.g., which may be attainable by thermonuclear fusion alone) around 20 to 30. Moreover, based on the fusion energy gain factor $Q_{fus}$, there may be little to no motivation to raise the pinch current above 1500 kA, as there is little to no expected increase in the fusion energy gain factor $Q_{fus}$ in such a pinch current regime (that is, the fusion energy gain factor $Q_{fus}$ may be considered "saturated" around 1200-1500 kA, whereat the upper limit 806 may be approached). However, if the fusion energy gain factor $Q_{fus,heat}$ is expected, there may be motivation to access higher pinch current regimes (e.g., greater than 1500 kA), as the fusion energy gain factor $Q_{fus,heat}$ may reach at least $10^2$ and even up to $10^3$ (or higher) depending on how high of an amplitude of the pinch current is commanded. More specifically, adjusting the pinch current higher than 1500 kA may account for alpha particle heating by correspondingly adjusting an applied magnetic field confining the plasma arc to induce sufficient thermal collisions between fusion byproducts (e.g., alpha particles) and a fuel gas such that a fusion energy gain factor of at least $10^2$ may be realized.

Referring now to FIG. 9, a plot 850 of a fraction of thermal energy recovered and a plasma density generated during operation of a plasma confinement system (e.g., any of the plasma confinement systems described in detail above with reference to FIGS. 1-4) as a function of a pinch current is shown. In the plot 850, an abscissa indicates the pinch current (I, in MA) and an ordinate indicates the fraction of thermal energy generated via alpha particle heating which is recovered by the plasma confinement system. A legend 855 indicates the plasma density of each plasma for which results are plotted at a relatively low pinch current of 0.3 MA. Specifically, a curve 811 indicates the fraction of alpha energy recovered for a plasma having a plasma density of $4.25\times10^{23}$ $m^{-3}$ at the pinch current of 0.3 MA, a curve 812 indicates the fraction of alpha energy recovered for a plasma having a plasma density of $2.1\times10^{24}$ $m^{-3}$ at the pinch current of 0.3 MA, a curve 813 indicates the fraction of alpha energy recovered for a plasma having a plasma density of $4.25\times10^{24}$ $m^{-3}$ at the pinch current of 0.3 MA, and a curve 814 indicates the fraction of alpha energy recovered for a plasma having a plasma density of $8.5\times10^{24}$ $m^{-3}$ at the pinch current of 0.3 MA. For each of the curves 811, 812, 813, and 814, the plasma density may increase according to an adiabatic scaling. For example, a plasma having a plasma density of $8.5\times10^{24}$ $m^{-3}$ at the pinch current of 0.3 MA (e.g., the curve 814) may increase to $3.9\times10^{25}$ $m^{-3}$ or greater at a pinch current of 0.5 MA (e.g., at point 851), $3.1\times10^{26}$ $m^{-3}$ or greater at a pinch current of 1.0 MA (e.g., at point 852), $1.1\times10^{27}$ $m^{-3}$ or greater at a pinch current of 1.5 MA (e.g., at point 853), and $2.5\times10^{27}$ $m^{-3}$ or greater at a pinch current of 2.0 MA (e.g., at point 854). In certain embodiments, alpha particle heating may contribute to greater fractions of alpha energy recovered, especially at higher plasma densities, than otherwise expected. For example, a plasma having a plasma density of $8.5\times10^{24}$ $m^{-3}$ at the pinch current of 0.3 MA (e.g., the curve 814) may have an energy recovery of roughly 10 percent (e.g., within 8-12%) for currents of 0.3-1.0 MA (e.g., at points 851 and 852), but that may increase to roughly 20 percent (e.g., within 18-22%) at 1.5 MA (e.g., at point 853) and 30 percent or greater at a pinch current of 2.0 MA (e.g., at point 854).

Embodiments of the present disclosure can be described in view of the following clauses:

1. A system, including non-transitory memory to store executable instructions that, if executed by one or more processors, cause the system to:
   adjust one or more operating parameters to generate a magnetic field which is sufficiently strong to:
   axially compress a fuel gas to induce thermonuclear fusion; and
   increase a fusion energy gain factor greater than a fusion energy gain factor limit attainable by the thermonuclear fusion.
2. The system of clause 1, wherein the one or more operating parameters includes one or more of an amplitude of a discharge current applied to the fuel gas, an applied voltage driving the discharge current, or a pulse duration of the discharge current.
3. The system of clause 2, wherein the executable instructions that, if executed by the one or more processors, cause the system to adjust the one or more operating parameters include instructions that, if executed by the one or more processors, cause the system to:
   adjust one or more of the amplitude of the discharge current to greater than 1.5 MA, the applied voltage driving the discharge current to greater than 15 kV, or the pulse duration of the discharge current to less than 300 μs.
4. The system of any one of clauses 1-3, wherein the executable instructions that, if executed by the one or more processors, cause the system to adjust the one or more operating parameters include instructions that, if executed by the one or more processors, cause the system to:
   adjust a duty cycle of the discharge current applied to the fuel gas.
5. The system of any one of clauses 1-4, wherein the magnetic field increases the fusion energy gain factor greater than the fusion energy gain factor limit by inducing thermal collisions between a byproduct of the thermonuclear fusion and the fuel gas.
6. The system of any one of clauses 1-5, wherein the fusion energy gain factor is greater than 100 and the fusion energy gain factor limit is less than 100.
7. The system of any one of clauses 1-6, wherein the fuel gas includes one or both of a neutral gas or an ionized gas.
8. The system of any one of clauses 1-7, further including a Z-pinch plasma confinement system in which the magnetic field is generated.
9. A plasma confinement system, including:
   a plasma confinement chamber; and
   a controller including executable instructions stored in non-transitory memory which, if executed by one or more processors of the controller, cause the controller to:
   identify a threshold amount of thermal collisions of alpha particles with a fuel gas; and
   adjust a duty cycle of a discharge current applied to the fuel gas contained within the plasma confinement chamber to achieve the threshold amount of thermal collisions of the alpha particles with the fuel gas.
10. The plasma confinement system of clause 9, wherein the executable instructions, if executed by the one or more processors, cause the controller to adjust the duty cycle by:
   one or more of increasing an amplitude of the discharge current to greater than 1.5 MA, increasing an applied voltage driving the discharge current to greater than 15 kV, or decreasing a pulse duration of the discharge current to less than 300 μs.
11. The plasma confinement system of any one of clauses 9 or 10, wherein the executable instructions, if executed by the one or more processors, cause the controller to adjust the duty cycle by:
   one or more of adjusting the amplitude of the discharge current to between 1.5 MA and 2.0 MA or adjusting the applied voltage driving the discharge current to between 15 kV and 75 kV.
12. The plasma confinement system of any one of clauses 9-11, wherein the executable instructions, if executed by the one or more processors, cause the controller to adjust the duty cycle by:
   adjusting the pulse duration of the discharge current to between 50 μs and 300 μs.
13. The plasma confinement system of any one of clauses 9-12, wherein the executable instructions, if executed by the one or more processors, cause the controller to adjust the duty cycle by:
   increasing an area under a time curve of the duty cycle.
14. The plasma confinement system of any one of clauses 9-12, wherein the executable instructions, if executed by the one or more processors, cause the controller to adjust the duty cycle by:
   maintaining an area under a time curve of the duty cycle.
15. The plasma confinement system of any one of clauses 9-14, wherein the plasma confinement system is a Z-pinch plasma confinement system.
16. A method, including:
   adjusting a magnetic field from a first intensity value applied to axially compress a fuel gas within a plasma confinement chamber to a second intensity value which results in greater thermal collisions between alpha particles and the fuel gas than the magnetic field at the first intensity value.
17. The method of clause 16, wherein the magnetic field is adjusted by:
   one or more of increasing an amplitude of a discharge current to between 1.5 MA and 2.0 MA, increasing an applied voltage driving the discharge current to between 15 kV and 75 kV, or decreasing a pulse duration of the discharge current to between 50 μs and 300 μs.

18. The method of any one of clauses 16 or 17, wherein the plasma confinement chamber is configured within a Z-pinch plasma confinement system.

19. The method of any one of clauses 16-18, wherein the magnetic field is stabilized throughout the adjustment by a sheared ion velocity flow driven by the discharge current.

20. The method of any one of clauses 16-19, wherein the magnetic field is adjusted to induce sufficient thermal collisions between the alpha particles and the fuel gas such that a fusion energy gain factor of at least $10^2$ is realized.

The specification and drawings are to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood. however, that there is no intention to limit the invention to the specific form or forms disclosed but, on the contrary, the intention is to cover all modifications, alternative constructions, and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. Similarly, use of the term "or" is to be construed to mean "and/or" unless contradicted explicitly or by context. The terms "comprising," "having," "including," and "containing" are to be construed as open-ended terms (i.e., meaning "including, but not limited to,") unless otherwise noted. The term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal. The use of the phrase "based on," unless otherwise explicitly stated or clear from context, means "based at least in part on" and is not limited to "based solely on."

Conjunctive language, such as phrases of the form "at least one of A, B, and C," or "at least one of A, B and C," (i.e., the same phrase with or without the Oxford comma) unless specifically stated otherwise or otherwise clearly contradicted by context, is otherwise understood within the context as used in general to present that an item, term, etc., may be either A or B or C, any nonempty subset of the set of A and B and C, or any set not contradicted by context or otherwise excluded that contains at least one A, at least one B, or at least one C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}, and, if not contradicted explicitly or by context, any set having {A}, {B}, and/or {C} as a subset (e.g., sets with multiple "A"). Thus, such conjunctive language is not generally intended to imply that certain embodiments require at least one of A, at least one of B and at least one of C each to be present. Similarly, phrases such as "at least one of A, B, or C" and "at least one of A, B or C" refer to the same as "at least one of A, B, and C" and "at least one of A, B and C" refer to any of the following sets: {A}, {B}, {C}, {A, B}, {A, C}, {B, C}, {A, B, C}, unless differing meaning is explicitly stated or clear from context. In addition, unless otherwise noted or contradicted by context, the term "plurality" indicates a state of being plural (e.g., "a plurality of items" indicates multiple items). The number of items in a plurality is at least two but can be more when so indicated either explicitly or by context.

Operations of processes described herein can be performed in any suitable order unless otherwise indicated herein or otherwise clearly contradicted by context. In an embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In an embodiment, the code is stored on a computer-readable storage medium, for example, in the form of a computer program comprising a plurality of instructions executable by one or more processors. In an embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In an embodiment, code (e.g., executable code or source code) is stored on a set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media, in an embodiment, comprises multiple non-transitory computer-readable storage media, and one or more of individual non-transitory storage media of the multiple non-transitory computer-readable storage media lack all of the code while the multiple non-transitory computer-readable storage media collectively store all of the code. In an embodiment, the executable instructions are executed such that different instructions are executed by different processors—for example, in an embodiment, a non-transitory computer-readable storage medium stores instructions and a main CPU executes some of the instructions while a graphics processor unit executes other instructions. In another embodiment, different components of a computer system have separate processors and different processors execute different subsets of the instructions.

Accordingly, in an embodiment, computer systems are configured to implement one or more services that singly or collectively perform operations of processes described herein, and such computer systems are configured with applicable hardware and/or software that enable the performance of the operations. Further, a computer system, in an embodiment of the present disclosure, is a single device and, in another embodiment, is a distributed computer system comprising multiple devices that operate differently such that the distributed computer system performs the operations described herein and such that a single device does not perform all operations.

The use of any and all examples or exemplary language (e.g., "such as") provided herein is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references including publications, patent applications, and patents cited herein are hereby incorporated by reference to the same extent as if each reference were individually and specifically indicated to be incorporated by reference and were set forth in its entirety herein.

The invention claimed is:

1. A system, comprising non-transitory memory to store executable instructions that, if executed by one or more processors, cause the system to:

adjust one or more operating parameters to:

adjust a plasma density of a plasma to and/or generate a magnetic field that is sufficiently strong to induce thermal collisions of fusion byproducts with the plasma that adjust a fusion energy gain factor, wherein the plasma is generated within a Z-pinch plasma confinement system.

2. The system of claim 1, wherein the one or more operating parameters comprise one or more of an amplitude of a discharge current, an applied voltage driving the discharge current, or a pulse duration of the discharge current.

3. The system of claim 2, wherein the executable instructions that, if executed by the one or more processors, cause the system to adjust the one or more operating parameters comprise instructions that, if executed by the one or more processors, cause the system to:

adjust one or more of the amplitude of the discharge current to greater than 1.2 MA, the applied voltage driving the discharge current to greater than 15 kV, or the pulse duration of the discharge current to less than 300 μs.

4. The system of claim 2, wherein the executable instructions that, if executed by the one or more processors, cause the system to adjust the one or more operating parameters comprise instructions that, if executed by the one or more processors, cause the system to apply the discharge current to cause the plasma to be compressed.

5. The system of claim 1, wherein the executable instructions that, if executed by the one or more processors, cause the system to adjust the one or more operating parameters comprise instructions that, if executed by the one or more processors, cause the system to:

adjust the one or more operating parameters according to an adiabat that includes a plasma density of at least $2.1\times10^{24}$ $m^{-3}$ at a discharge current of 0.3 MA.

6. The system of claim 1, wherein the magnetic field and/or the adjusted plasma density achieves a fusion energy gain factor greater than 30 by inducing the thermal collisions of the fusion byproducts with the plasma.

7. The system of claim 1, wherein the magnetic field is generated to be sufficiently strong to and/or the plasma density is adjusted to increase the fusion energy gain factor to greater than 100.

8. The system of claim 1, wherein the magnetic field is to induce the thermal collisions of the fusion byproducts with the plasma at least by restricting trajectories of the fusion byproducts.

9. A Z-pinch plasma confinement system, comprising:

a plasma confinement chamber; and a controller including executable instructions stored in non-transitory memory which, if executed by one or more processors of the controller, cause the controller to:

identify a threshold amount of thermal collisions of alpha particles with a plasma contained within the plasma confinement chamber; and adjust a plasma density of the plasma to achieve the threshold amount of thermal collisions of the alpha particles with the plasma and/or adjust a discharge current applied within the plasma confinement chamber to achieve the threshold amount of thermal collisions of the alpha particles with the plasma.

10. The Z-pinch plasma confinement system of claim 9, wherein the executable instructions, if executed by the one or more processors, cause the controller to adjust the discharge current by:

one or more of increasing an amplitude of the discharge current to greater than 1.2 MA, increasing an applied voltage driving the discharge current to greater than 15 kV, or decreasing a pulse duration of the discharge current to less than 300 μs.

11. The Z-pinch plasma confinement system of claim 9, wherein the executable instructions comprise further instructions that, if executed by the one or more processors, cause the controller to:

provide a fuel gas to the plasma confinement chamber, the fuel gas comprising one or both of a neutral gas or the plasma.

12. The Z-pinch plasma confinement system of claim 9, wherein the executable instructions that, if executed by the one or more processors, cause the controller to adjust the discharge current comprise further instructions that, if executed by the one or more processors, cause the controller to:

maintain an area under a time curve of the discharge current.

13. The Z-pinch plasma confinement system of claim 9, wherein the executable instructions, if executed by the one or more processors, cause the controller to adjust the plasma density by:

one or more of adjusting neutral gas puffing to the plasma confinement chamber, adjusting plasma injection to the plasma confinement chamber, or adjusting magnetic field strength within the plasma confinement chamber.

14. The Z-pinch plasma confinement system of claim 9, wherein the executable instructions that, if executed by the one or more processors, cause the controller to adjust the discharge current comprise further instructions that, if executed by the one or more processors, cause the controller to:

adjust an area under a time curve of the discharge current.

15. The Z-pinch plasma confinement system of claim 9, wherein the executable instructions, if executed by the one or more processors, cause the controller to adjust the plasma density and/or the discharge current at least by adjusting from a first adiabat, including a first plasma density at a first discharge current, to a second adiabat, including a second plasma density at a second discharge current.

16. A method, comprising:

indicating, to a plasma confinement system, a threshold amount of thermal collisions of fusion byproducts with a plasma that results in a fusion energy gain factor of at least 30; and adjusting one or more operating parameters of the plasma confinement system to apply a discharge current to compress the plasma and achieve the threshold amount of thermal collisions of the fusion byproducts with the plasma.

17. The method of claim 16, wherein adjusting the one or more operating parameters comprises:

maintaining or increasing an area under a time curve of the discharge current.

18. The method of claim 16, wherein adjusting the one or more operating parameters to apply the discharge current initiates or drives a stabilizing sheared ion velocity flow.

19. The method of claim 16, wherein the plasma confinement system is a Z-pinch plasma confinement system.

20. The method of claim 16, wherein the one or more operating parameters comprise one or more of an amplitude of the discharge current, an applied voltage driving the discharge current, or a pulse duration of the discharge current.

21. A system, comprising a controller including executable instructions stored in non-transitory memory which, if executed by one or more processors of the controller, cause the controller to:

adjust one or more operating parameters of the system from a first phase of operation that realizes a first fusion energy gain factor to a second phase of operation that adjusts the first fusion energy gain factor to a second fusion energy gain factor, wherein the first phase of operation generates a magnetic field at a first intensity value and a plasma compressed by the magnetic field to a first density, and wherein, during the second phase of operation, the magnetic field is adjusted from the first intensity value to a second intensity value and/or the plasma is adjusted from the first density to a second density.

22. The system of claim 21, wherein the system is a Z-pinch plasma confinement system in which the plasma is to be compressed.

23. The system of claim 21, wherein adjusting the magnetic field from the first intensity value to the second intensity value and/or adjusting the plasma from the first density to the second density, during the second phase of operation, adjusts an amount of thermal collisions between the plasma and fusion byproducts.

24. The system of claim 21, wherein the second fusion energy gain factor is greater than the first fusion energy gain factor.

* * * * *